(12) United States Patent
Wilcox et al.

(10) Patent No.: US 7,194,708 B2
(45) Date of Patent: Mar. 20, 2007

(54) GENERATION OF CLOCK GATING FUNCTION FOR SYNCHRONOUS CIRCUIT

(75) Inventors: Stephen Paul Wilcox, Cambridge (GB); Paul Alexander Cunningham, Cambridge (GB)

(73) Assignee: Azuro (UK) Limited (CA)

( * ) Notice: Subject to any disclaimer, the term of this patent is extended or adjusted under 35 U.S.C. 154(b) by 397 days.

(21) Appl. No.: 10/761,156

(22) Filed: Jan. 20, 2004

(65) Prior Publication Data

US 2004/0153981 A1 Aug. 5, 2004

(30) Foreign Application Priority Data

Jan. 20, 2003 (GB) ................................ 0301251.5

(51) Int. Cl.
*G06F 17/50* (2006.01)
(52) U.S. Cl. .............................................. 716/4; 716/3
(58) Field of Classification Search .................... 716/4, 716/3, 6; 703/15; 713/400
See application file for complete search history.

(56) References Cited

U.S. PATENT DOCUMENTS

| 5,502,648 | A | | 3/1996 | Kaplan |
| 5,801,955 | A | * | 9/1998 | Burgun et al. ................. 716/6 |
| 5,831,866 | A | * | 11/1998 | Burgun et al. ................. 716/6 |
| 5,864,487 | A | * | 1/1999 | Merryman et al. ............ 716/6 |
| 5,980,092 | A | * | 11/1999 | Merryman et al. ............ 716/6 |
| 6,009,531 | A | * | 12/1999 | Selvidge et al. ............ 713/400 |
| 6,252,448 | B1 | | 6/2001 | Schober |
| 6,301,553 | B1 | * | 10/2001 | Burgun et al. ................ 703/15 |
| 6,434,722 | B2 | * | 8/2002 | Kawarabayashi et al. ...... 716/3 |
| 6,643,829 | B1 | * | 11/2003 | Borkovic et al. .............. 716/3 |
| 6,681,377 | B2 | * | 1/2004 | Beletsky ....................... 716/6 |
| 6,874,134 | B1 | | 3/2005 | Collin et al. |

OTHER PUBLICATIONS

Wu et al., Clock-gating and Its Application to Low Power Design of Sequential Circuits, Mar. 2000, IEEE, vol. 47, pp. 415-419.
Lang et al., Individual Flip Flop with Gated Clocks for Low Power Datapaths, Jun. 1997, IEEE, vol. 44, pp. 507-516.

* cited by examiner

*Primary Examiner*—Leigh M. Garbowski

(57) ABSTRACT

There is disclosed a method, and corresponding apparatus, for determining a clock gating function for a set of clocked state-holding elements, comprising the steps of: for each element, determining the conditions under which the element will hold its current value based only on those inputs which are common to all elements; and combining the conditions to form a gating function.

24 Claims, 15 Drawing Sheets

FIG. 5
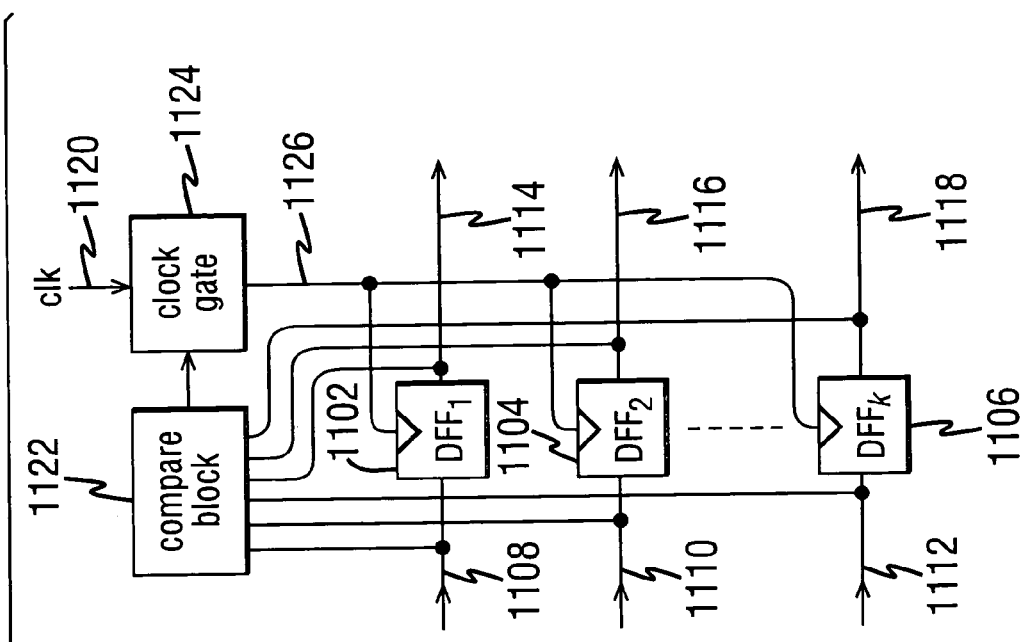
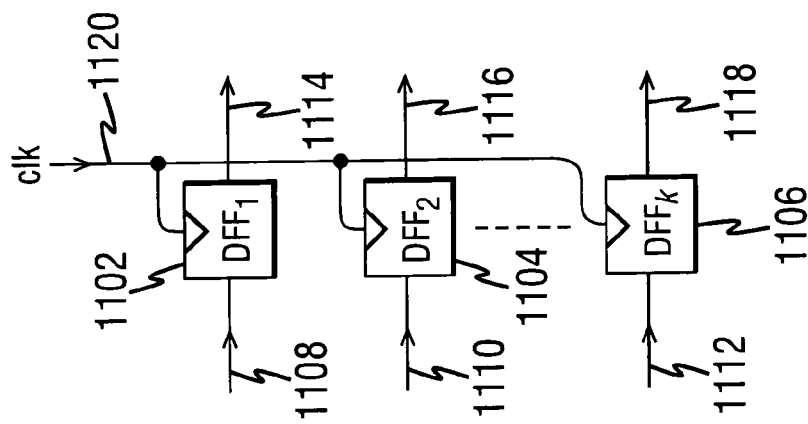

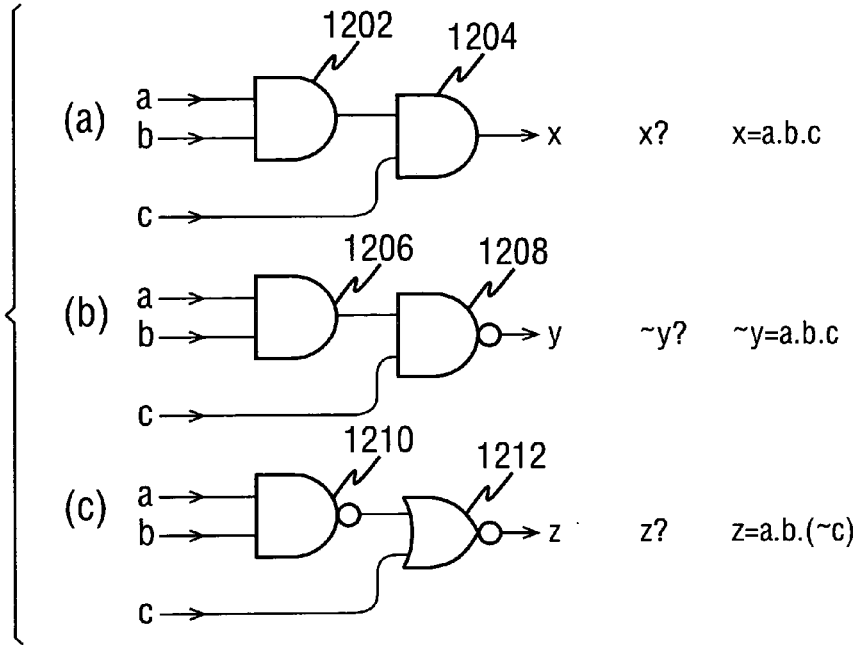
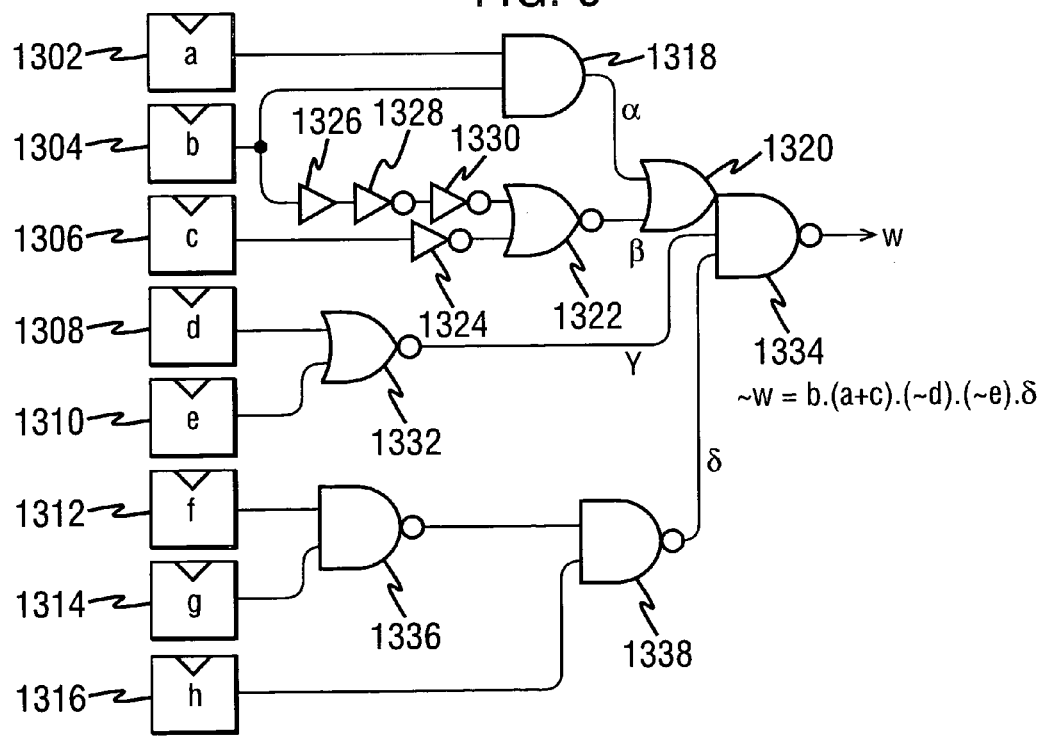

GENERATION OF CLOCK GATING FUNCTION FOR SYNCHRONOUS CIRCUIT

FIELD OF THE INVENTION

The present invention relates to clock gating for clocked state-holding elements in synchronous circuits, and particularly but not exclusively to clock gating in circuit to circuit translation tools.

BACKGROUND OF THE INVENTION

The model of a synchronous circuit is that the circuit is composed of logic blocks, which compute a value after a finite delay, and clocked state-holding elements such as D-type flip-flops (DFFs). Each computational step takes one clock period, and at the end of every clock period, every DFF in the design has its state re-assigned in dependence on the computational step taken place. In dependence on the computational step, the reassigned state may in fact be the same as the previous state.

Clocked state elements such as D-type flip-flops (DFFs) are well-known in the art, as is the construction of such elements. The clock input to a DFF element typically has about six times the capacitance of a normal gate if the internal gates of the element are included, and thus switching the clock input takes about six times the power that it takes to switch a typical gate in the circuit.

The clock input to a clocked state element also changes more frequently than any other wire in a circuit. The clock line changes state twice per clock cycle, a switching activity of 200%, whereas a reasonable upper bound for the switching activity of all other nodes in the circuit is about 30%. This implies that driving the clock input to a clocked state element is about 40 times (6*(200/30)) as expensive as driving any other gate input in the circuit. If it is assumed that 10% of the gates in a design are DFFs, which is a reasonable figure for a well-pipelined modern design, this equates to 70% of the total clock power being spent on clocking the DFFs.

As a consequence of the above disadvantages, clock gating is a well-known technique in which transitions on the clock wire to certain registers are blocked when it is known that those registers are not active. By preventing a rising and falling transition on a bank of registers whenever the output of that register will not change anyway, i.e. it is not active, a significant fraction of a circuits power consumption can be saved.

Automated tools exist in the art for designing synchronous circuits, which include tools for designing clock gating. The current state-of-the-art in automatic clock gating tools performs a technique known as RTL (register transfer level) clock gating, because it operates at the register transfer level. An RTL description is a structural abstraction of a synchronous circuit into programming language, like constructs, which can be easily translated (or synthesised) into a schematic by a tool such as a design compiler tool, which tools are well-known in the art.

An example of an RTL description is the following:

```
module test ( D, start, A, B, clock );
    output  [7:0]  D;
    input   [7:0]  A, B;
    input          start;
    reg     [7:0]  C, D;
    always  (@posedge clock)
    begin
        C <= A + B;
        if (start) D <= 0;
        else if (C<D) D <= C;
    end
endmodule
```

In the example above, on every clock tick, A is added to B and placed in C. Also, a comparison is made between C and D. If start is true then D is set to zero, if start is false and C is less than D, then D is set to whatever C is, and otherwise D is left alone.

When this RTL code is synthesized (converted from a textual description to a circuit), the assumption that all DFFs are clocked on every cycle means that D cannot be just left alone—it must be assigned a value, and that value needs to be its current output. This wastes energy clocking the same value back in to the register, i.e. the current value is clocked back into the register as its new value.

A tool that performs RTL level clock gating has a way to avoid this wasted clock energy. It can see from the RTL that there is a condition under which the register may be left alone, as its state does not change; this is used to gate (i.e. to turn off) the clock to the register. Extra gates are inserted between the global clock pin and the clock inputs to the registers making up the register, which block the rising and falling clock edge if start is false and C is greater than or equal to D. If the register is only clocked when either (start=1) or (start=0 and C<D), then the multiplexer can be simplified to just consider the value of start, because this differentiates between the two remaining conditions. In this way, the logic for the register is simplified.

Clock gating as described above adds gates to the circuit, and these extra gates add both area and power. If a designer is not careful, the extra clock gating hardware can consume more power than is saved by limiting the clocking of the register. For this reason, existing clock gating tools specify a lower limit on the size of registers that can be gated. For example, a tool may apply a rule such as "only gate when the register is four bits wide or more". Area can be affected, although this can be either up or down. Removing the "D stays the same" case in the example above saves area, but adding the clock gating hardware costs area.

The style of clock gating that is usually used is termed full-cycle gating. This gating style adds a transparent latch and an AND gate to the clock wire, which is expensive because clocking a latch usually takes about two-thirds of the power of clocking a DFF (about 4 standard input loads) plus another single load for the AND gate. Effectively, this style adds almost an entire new DFF load to the clock, which is acceptable if a large bus is unused for most of the time. On the other hand, if a four-bit bus is unused 20% of the time, the extra gating hardware will actually take more power than it saves. The combination of the transparent latch and AND gate is often referred to as a "clock gating cell".

The alternative to full-cycle gating is termed half-cycle gating. In half-cycle gating only a single gate is attached to the clock, an OR gate, and so this arrangement would still save power in the case of a four-bit bus unused 20% of the time.

The timing behaviour of half-cycle clock gating is worse than full-cycle clock gating. A half-cycle gate used to create a rising clock edge needs to know on the previous falling edge whether the gating will occur or not. Assuming a typical mark-space ratio of 50%, this gives only half a cycle in which to make a decision. A full-cycle gate starts low, so it can wait to make a decision until the rising clock edge arrives.

The contrast between full-cycle and half-cycle gating is not well known, even though most experienced designers are aware of the two different styles. They are seen as alternative ways to achieve the same end, but there are very definitely advantages and disadvantages to each: full-cycle is safer from the timing point of view but consumes more power and a fair amount of area; half-cycle must be used with caution to avoid breaking timing, but is lightweight, consuming little power and little area.

Current RTL-level clock-gating tools require the designer to specify the kind of gating they require up front. If the designer chooses half-cycle gating, this would slow down the circuit by a factor of two, so the designer in practice always chooses full-cycle gating. Half-cycle and full-cycle gates have never been mixed in a single design, because their interactions are in general not well understood. Current design techniques thus produce a design with complete full-cycle gating, and thus all clock gating cells are implemented with maximum size, consuming maximum circuit area and power.

Current RTL-based clock gating tools create at most a single gating expression for every register in the design, so they insert a single full-cycle gating cell between the clock and a register. Thus current designs provide a number of full-cycle gates corresponding to the number of registers in the design, thus potentially each register takes up additional space and power in the implementation of clock gating. Methods have been suggested for gating clocks at a finer grain than at the RTL register level. Lang, Musoll, Cortadella, 'Individual Flip-Flops with Gated Clocks for Low Power Data Paths', IEEE Trans on Circuits and Systems—II: Analog and Digital Signal Processing, vol. 44, no. 6, June 1997 has suggested using an XOR gate to directly compare the D input and Q output of an individual DFF element, and to gate the clock locally, at the element level, if the input and output are the same. The clock gate must be a half-cycle gate to save any power in this context, and this places unwelcome restrictions on either the cycle time (which almost doubles) or the mark-space ratio of the clock (which causes its own problems). Lang et al. also use NAND and OR gates to substitute for an XOR gate in the clock gate cell, if such gates would save more power. Although this approach is technically interesting, its drawbacks mean that it has been limited to academia, and has never been accepted in commercial design environments. The approach teaches that each individual gate which is to be clock gated should be connected to an individual clock gate, which introduces, in theory, multiple clock gates per register. Lang et al therefore does not offer an approach which can be implemented practically in a complex circuit design tool.

Thus although Lang et al offers an alternative to the conventional RTL approach, in analyzing a forced gating technique at a lower level, it does not offer a practical implementation.

It is an aim of embodiments of the present invention to provide an improved technique which addresses certain ones of the above-stated problems.

SUMMARY OF THE INVENTION

According to the present invention there is provided a method of determining a clock gating function for a set of clocked state-holding elements, comprising the steps of: for each element, determining the conditions under which the element will hold its current value based only on those inputs which are common to all elements; and combining the conditions to form a gating function.

The method may further comprise the step, for each element, of defining a Boolean function consisting of the variables forming the input to each element. The step of determining the conditions under which the element will hold its current value may be based on said Boolean functions. The Boolean function may be limited to the variables being common to the inputs of all elements.

The method may further comprise the steps of: determining a first set of variables that are common to logic functions forming the input to all elements; and determining a second set of variables that are not common, such that in tracing back an input of any element a variable of each set is always found. The step of defining the Boolean function for each element may be dependent only upon those variables in the first and second sets. The step of defining the Boolean function for each element may be dependent only upon those variables in the first set.

The step of defining the Boolean function for each element may comprise defining a Boolean function in dependence on those variables in the first and common sets, and subsequently eliminating those variables in the second set.

The step of determining the first and second sets of inputs comprises the steps of: defining an input cone for each element, the respective input cones being determined by tracing back from the input of each element through a predetermined number of gates, and entering all variables located in the respective input cone; determining the variables in the input cones which are common to all input cones; tracing back from each element until any common variable is found, wherein all common variables found define the first set; tracing back from each element until any variable in the first set is found, wherein all variables traced to a variable in the first set define a set L; defining a set M comprising all variables in the input cones which are not included in set L; and tracing back from each element until any variable in the set M is found, wherein any such variable from M which is found is included in the second set.

There may be allocated a maximum size to the first set, wherein the step c) is terminated if said maximum size is reached. The tracing of an input path may be terminated in step c) if a common variable is identified. The tracing of an input path may be terminated in step c) if a variable not in an input cone is identified.

The method may be enabled responsive to the Boolean function for each element being dependent upon the output of the element. The conditions may be combined in an AND function. The method may further comprise the step of creating a gate structure corresponding to the combined conditions.

The method may further comprise the steps of, for each element, determining a revised Boolean function which provides the same result as the original Boolean function when the gating function has a logical value of 1. The method may further comprise selectively replacing a defined Boolean function with a revised Boolean function in dependence upon a comparison of each defined and revised Boolean function to determine the most efficient function. The most efficient function may be the one associated with the smallest implementation in terms of logical gates.

A computer program product may include computer program code for carrying out any defined method.

According to a further aspect of the present invention there is provided apparatus for determining a clock gating function for a set of clocked holding state elements, comprising: means for determining, for each element, the conditions under which the element will hold its current value based only on those inputs which are common to all elements; and means for combining the conditions to form a gating function.

The apparatus may further comprise means for defining, for each element, a Boolean function consisting of the variables forming the input to each element.

The apparatus may further comprise: means for determining a first set of variables that are common to logic functions forming the input to all elements; and means for determining a second set of variables that are not common, such that in tracing back an input of any element a variable of each set is always found.

The apparatus may comprise: means for defining an input cone for each element, the respective input cones being determined by tracing back from the input of each element through a predetermined number of gates, and entering all variables located in the respective input cone; means for determining the variables in the input cones which are common to all input cones; means for tracing back from each element until any common variable is found, wherein all common variables found define the first set; means for tracing back from each element until any variable in the first set is found, wherein all variables traced to a variable in the first set define a set L; means for defining a set M comprising all variables in the input cones which are not included in set L; and means for tracing back from each element until any variable in the set M is found, wherein any such variable from M which is found is included in the second set.

The invention may further provide a computer system including any defined apparatus.

BRIEF DESCRIPTION OF THE DRAWINGS

The present invention is described herein by way of example with reference to the accompanying drawings in which:

FIGS. 5(a) and 5(b) illustrate the steps in a second principle stage of operation in accordance with a preferred embodiment of the present invention;

FIG. 8 illustrates a third principle stage of operation in accordance with a preferred embodiment of the present invention;

FIG. 9 further illustrates a third principle stage of operation in accordance with a preferred embodiment of the present invention;

DESCRIPTION OF THE PREFERRED EMBODIMENTS

Figure 1:
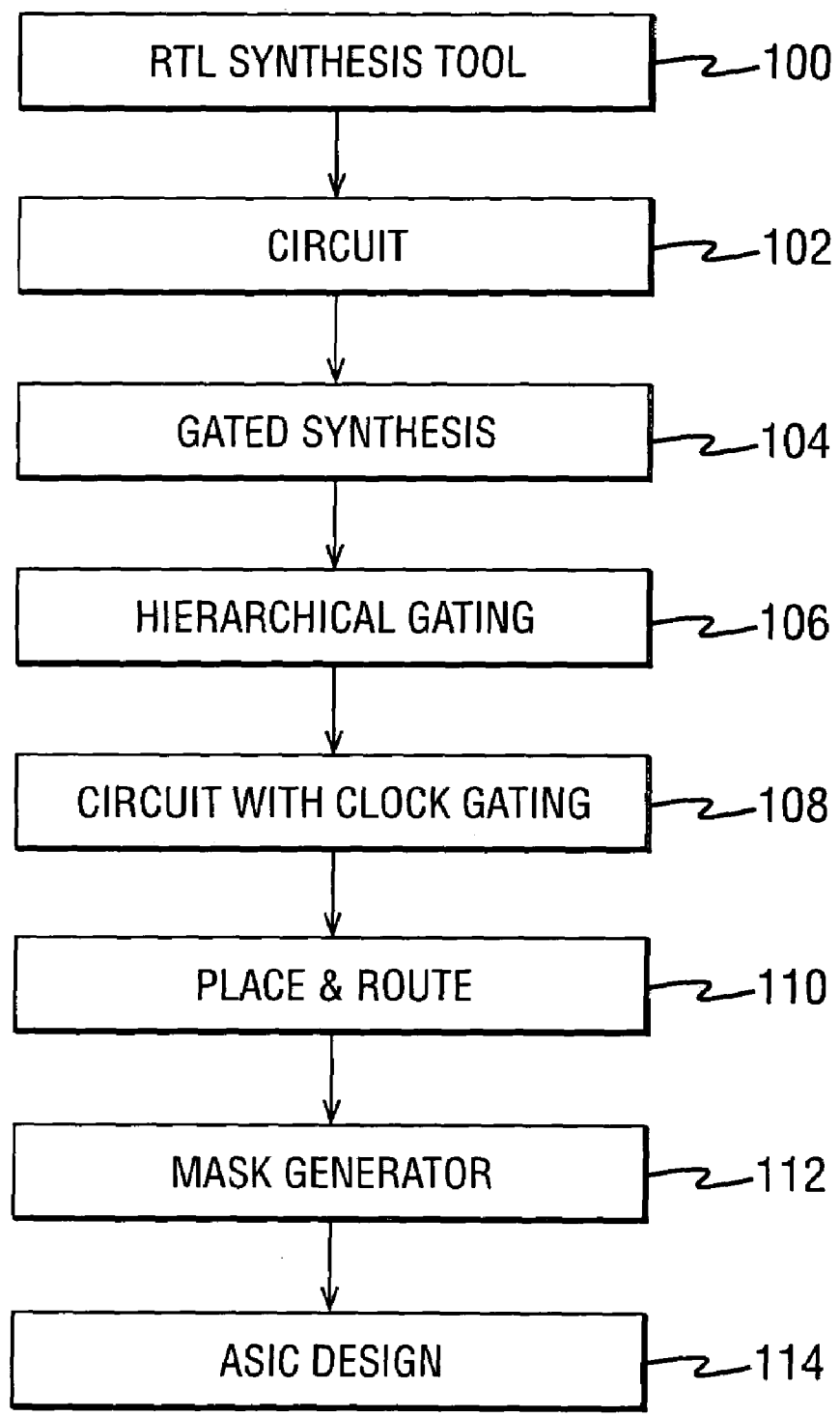
FIG. 1 illustrates the principle steps in a synchronous circuit design synthesis, including the steps in accordance with preferred embodiments of the present invention.

The present invention is described herein by way of reference to particular examples. In particular the present invention is described herein with reference to examples in which a D-type flip-flop is shown as an example of a clocked state holding element. However the invention is not limited to such a specific clocked state-holding element. Variations in the implementations will be apparent to one skilled in the art. In the drawings, like reference numerals in different Figures refer to elements which are the same in different figures.

Referring to FIG. 1, there are illustrated the main steps in performing a technique for designing an application specific integrated circuit (ASIC) incorporating the techniques of the present invention. In a step 100, an RTL synthesis tool is used to create a circuit, represented by step 102. Gating expressions may be generated in accordance with standard techniques.

In step 104 a gated synthesis stage is performed in accordance with preferred embodiments of the invention as described herein in order to generate a gating function and functions corresponding to inputs of clocked state elements in the circuit design. In a step 106 in accordance with preferred embodiments of the present invention a hierarchical gating structure is obtained.

In step 108, a circuit with the created clock gating structure is thus created. In step 110 a conventional place and route technique is performed. In step 112 a mask generator technique is performed. In step 114 the ASIC design is performed.

The invention is now described by way of reference to the steps carried out in preparing a preferred hierarchical clock gating structure for a circuit, utilizing preferred embodiments of the present invention, from the starting point of a circuit. The preferred hierarchical gating utilizes a novel structure in which full-cycle and half-cycle gates may be mixed. These steps involve two general preferred phases of operation: a gated synthesis phase and a hierarchical gating phase.

In an initial phase, prior to the gated synthesis and hierarchical gating phases, any clock gates in the original circuit are stripped. This is a conventional step, and is not described in any further detail herein. As discussed further hereinbelow, the stripped clock gates may be stored for further use later. However for the purpose of implementing the preferred steps of the present invention, a circuit with no clock gates is the starting point. Initially, the circuit in any event may have no clock gates associated therewith.

The principle function of the gated synthesis phase is to carry out a netlist gating step. A netlist is a list identifying each clocked state-holding element in the circuit, and for each such element a function which is based on the connections or wires, or selected ones of such connections or wires, which feed the input of that element.

Figure 2:
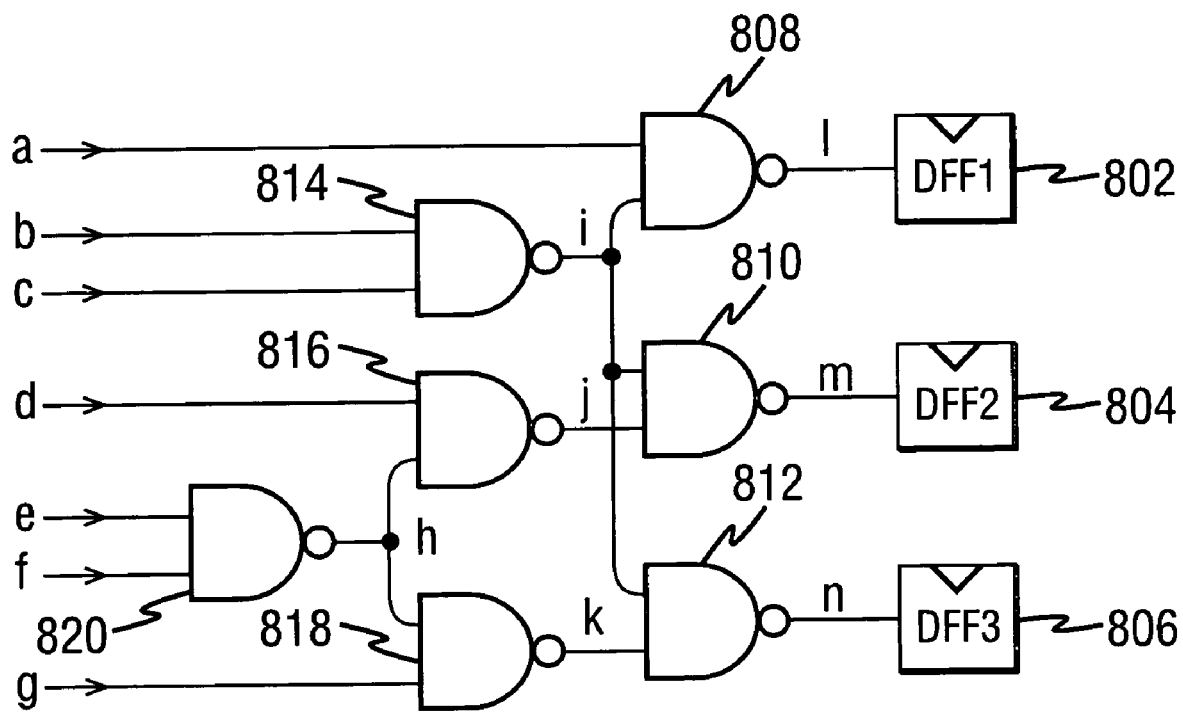
FIG. 2 illustrates a segment of a synchronous circuit design.

A key feature of the netlist gating function is the assumption that the input of each clocked state-holding element is dependent upon its output, i.e. that the next state of each element is dependent upon it's current state. The netlist therefore includes a function for each clocked state element, which is a function dependent on the gate logic feeding the input of the element. Referring to FIG. 2, there is shown a section of a circuit including three DFFs 802, 804, 806. Each of the DFFs 802,804,806 receives an input from an output of a respective NAND gate 808,810,812 on respective input lines l,m,n. Each of the NAND gates 808,810,812 receives one input on an input line i from the output of a NAND gate 814. The NAND gates 810 and 812 receive second inputs from outputs of respective NAND gates 816 and 818 on input lines j,k. The NAND gates 816,818 each receive an input from the output of NAND gate 820 on input line h. The NAND gate 808 receives a second input on input line a. The NAND gate 814 receives inputs on input lines b,c. The NAND gates 816 and 818 receive respective second inputs on input lines d and g. The NAND gate 820 receives a pair of inputs on input lines e,f. Each of the input lines can be considered to be a wire, and each of the input lines is labeled with a letter a–n.

The input lines a to g in FIG. 2 may be fed by further logic gates, may be fed from a terminal input, or may be fed directly by the output of a further clocked state-holding element.

The purpose of netlist gating in accordance with the preferred embodiments of the present invention is to identify the clocked state-holding elements in the circuit, and generate a function representing the gated inputs to each such element. This is achieved by identifying each individual clocked state-holding element, and then tracing back from the input of each such element to identify the input lines which feed the element, including those input lines which feed the element through gates. Ideally, all inputs should be traced back to a terminal input or to the output of another clocked state holding element.

Netlist gating in accordance with the preferred embodiment of the invention utilises an algorithm which can duplicate the action of RTL clock gating, but without seeing the register transfer level description. As discussed above the purpose of the netlist gating step is to generate, for each DFF in FIG. 2, a function which represents the input to that DFF. Such function represents the logic at the input to the DFF, i.e. the logic illustrated in FIG. 2. For the purpose of netlist gating, it is also essential that the function is partly dependent upon the output of the DFF.

Figure 4:
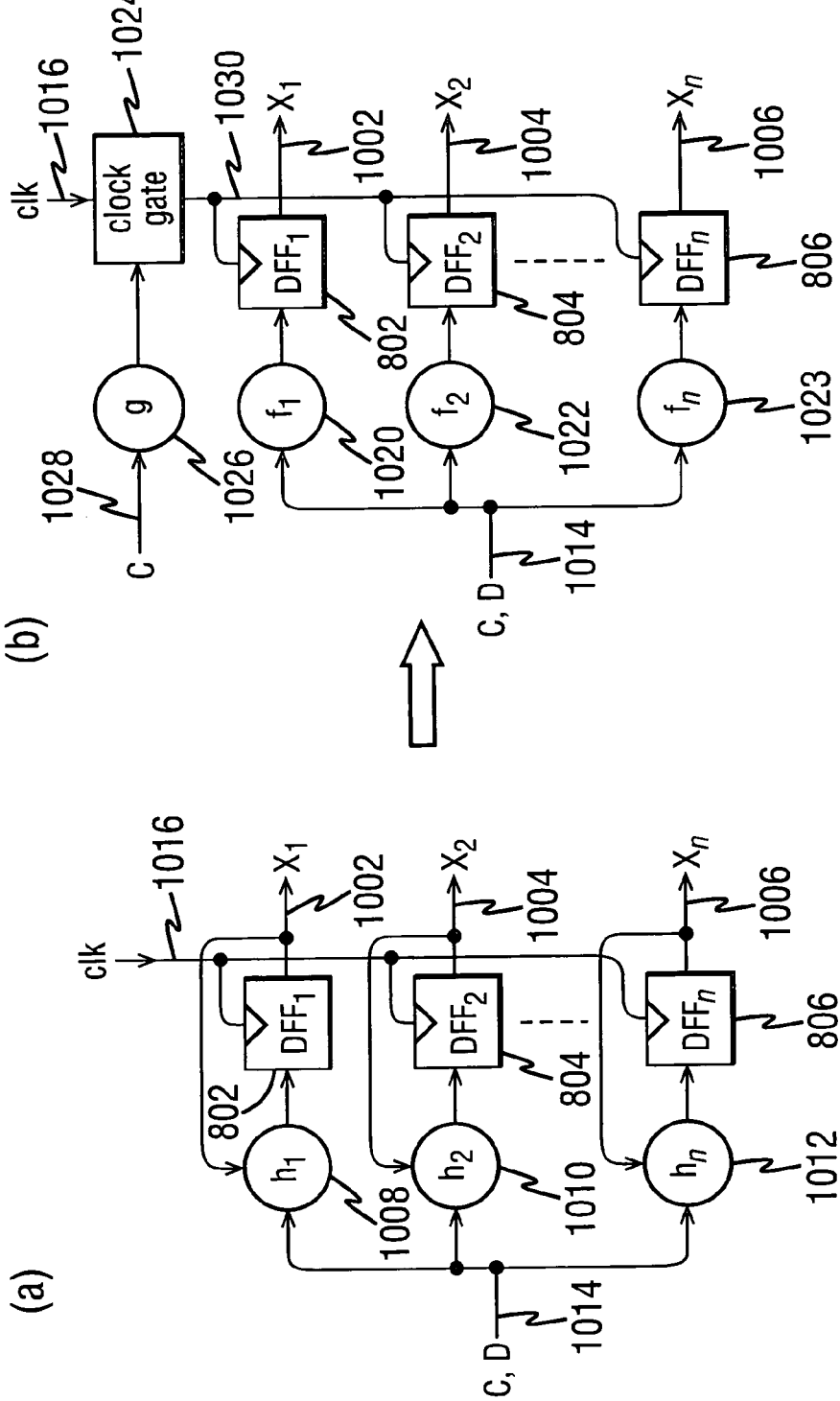
FIGS. 4(a) and 4(b) illustrate the steps in a first principle stage of operation in accordance with a preferred embodiment of the present invention.

This principle of netlist gating in accordance with a preferred embodiment is illustrated further with reference to FIG. 4(a). As illustrated in FIG. 4(a), the logic gates creating the input to a register, of which FIG. 2 is an example, can be replaced by a function h at the input to each DFF, which additionally receives an input from the output of the respective DFF. The purpose of netlist gating is to formulate such functions for each DFF.

Although FIG. 2 shows that the 'depth' of inputs to the DFFs is through a maximum of three gates, in practice the number of gates may exceed this. As discussed above the depth of inputs is traced back to a terminal input or to the output of another clocked state element. As such, the path to be traced back through the circuit can be complex. In order to make the construction of the functions in FIG. 4 practical, it is necessary to be able to select the wires of the logic shown in FIG. 2 to form the function of FIG. 4(a). Whilst the example of FIG. 2 is simple, in practice the gate logic at the inputs to the DFFs will be more complex. As such it is necessary to select the wires on a discriminatory basis, as to select all wires feeding the input to a DFF may result in a function which is too complex to implement in practice.

For this purpose the netlist gating step is preferably preceded by a step to generate the wires of the circuit upon which the netlist process should be based, i.e. to select the set(s) of wires that will be incorporated in the function generated by the netlist gating step. This step effectively determines a boundary in the circuit setting the limits for tracing back through the circuit when determining the functions in the netlist gating step. A preferable implementation of this initial step, is described below, although other techniques for determining the limitations for the netlist gating step can be used. The preferable technique described herein is termed 'common set finding', and is described hereinafter with specific reference to FIGS. 3 and 4. The common set finding utilizes a sub-algorithm which, as discussed further hereinbelow, finds the wires that are likely to have been used at the RTL level to create clock gating.

The embodiments of the present invention thus act at the clocked state-holding element level to produce a netlist result which is as functionally effective as providing a netlist result with an RTL tool.

The common set finding principle is described hereinafter with reference to an exemplary circuit. The input to the common set finding algorithm is, in general, a set S of D-type flip-flops (DFFs), more generally clocked state-holding elements, which make up an RTL-level register for the netlist. With reference to FIG. 2, the set S is the DFFs 802,804,806.

The output of the common set finding algorithm is a pair of sets of wires for the netlist gating algorithm, called set C and set D. Set C consists of wires which have their value used by every one of the DFFs in S, i.e. the common set. Set D consists of other wires, with the restriction that however the wires are traced back through the netlist from the data input of a DFF in S, an element of C or an element of D is always found. This can be more clearly understood with reference to the examples below.

There are several different sets of C's and D's that an algorithm, generally, may produce for a given circuit. The aim is to produce a good or optimal C and D pair. Examples of different pairs, and the relative advantages/disadvantages of such, are described below.

As discussed above, FIG. 2 shows an example netlist fragment, i.e. a fragment of a larger circuit. A common set finding algorithm could provide, for example, C={} and D={l, m, n} for this fragment, because this satisfies the conditions stated above. There is nothing in C, so the 'contents' of C are therefore common. Further, however, if a trace back from the DFFs 1,2,3 is performed, one of l, m or n is reached. However this pair of C and D is not a very useful pair of sets. If the algorithm had scanned back further through the circuit, it would have picked up that wire i is common to all three DFFs.

By way of further example, the set pair C={b,c}, D={a, e,g,j} is not a permissible output, because DFF2 can trace back through m,j, h and f and miss everything in C and D.

In another example a possible pair may be C={b,c}, D={a,d,e,f,g}. This satisfies the conditions stated above, but ideally should not be returned from the algorithm because it is not heuristically good. The heuristic requirements can be summarized as follows:

1. It is advantageous to go back as far as is necessary to find wires that are common between DFFs if these wires can be put in the set C.
2. It is disadvantageous to have a large number of elements in set D.
3. It is very disadvantageous to have a large number of elements in the set C.
4. It is extremely disadvantageous to put an element in the set D that, when tracing back from a DFF, will be reached before another element that is in the set C. This heuristic 4 stops a case such as C={i} and D={a,j,n}, for example.

Looking at the above heuristics, it is obvious from a visual inspection of FIG. 2 that the best result is C={i} and D={a,j,k}. On more complicated examples, however, it is much more difficult to simply see what the best result is from a visual inspection of the circuit. Furthermore, an automated technique for determining the sets C and D is necessary.

Thus the common set algorithm described below is provided to give good results, although not necessarily always the best results, on all circuits tried. The implementation of this common set algorithm is preferable, but not essential, before the netlist algorithm described below.

The common set algorithm is performed for all DFFs in a set, the set being denoted as S. The common set algorithm utilises two parameters, MaxCSize and SearchDepth. These parameters are both implementation dependent and do not affect the function of the algorithm. The parameter MaxCSize merely defines a maximum size for the set C, and the parameter SearchDepth defines the maximum depth from each DFF through which a path is traced. Both of these parameters may be set based on the particular implementation. The use of these parameters will be apparent from the following description. These parameters are pre-defined.

The selection of the parameters MaxCSize and SearchDepth are both basically time-of-run issues. MaxCSize may typically be 10, and SearchDepth may typically be 4. If the parameter MaxCSize is increased, marginally better results may be obtained, but at the risk of the tool taking a very long time. Changing SearchDepth can either increase or decrease the power saving, and it is difficult to predict how it will effect performance. The value of 4 may be chosen as a good compromise.

Figure 3:
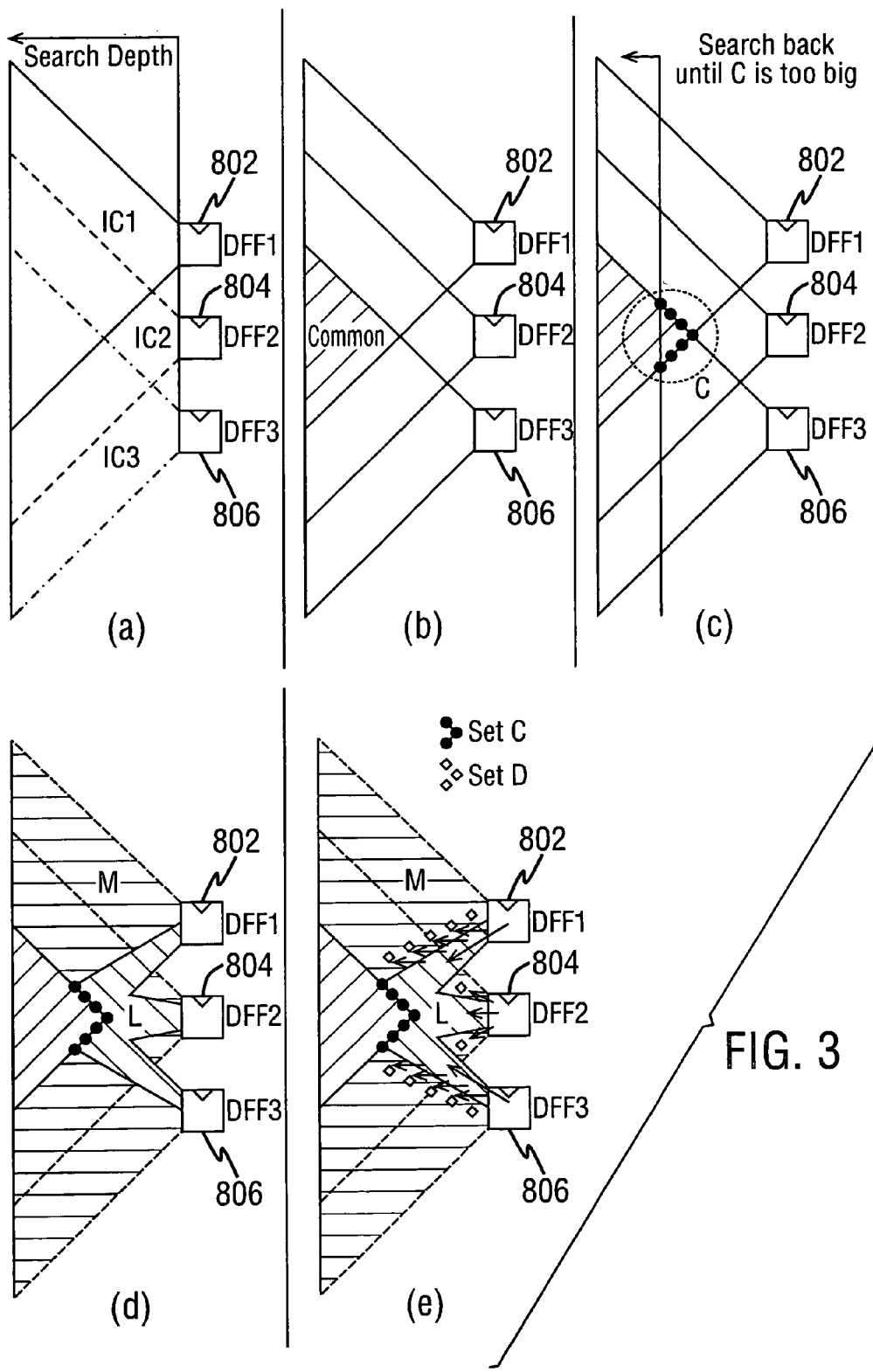
FIGS. 3(a) to 3(e) illustrates the steps in performing an initial stage of operation in accordance with an embodiment of the present invention.

The purpose of the sub-algorithm is to define the sets C and D. All stages of the algorithm are illustrated conceptually in FIG. 3. FIG. 3 illustrates the conceptual implementation of each step for a circuit having three DFFs, and the practicalities of such concept is then discussed in relation to the circuit fragment of FIG. 2.

Figure 14:
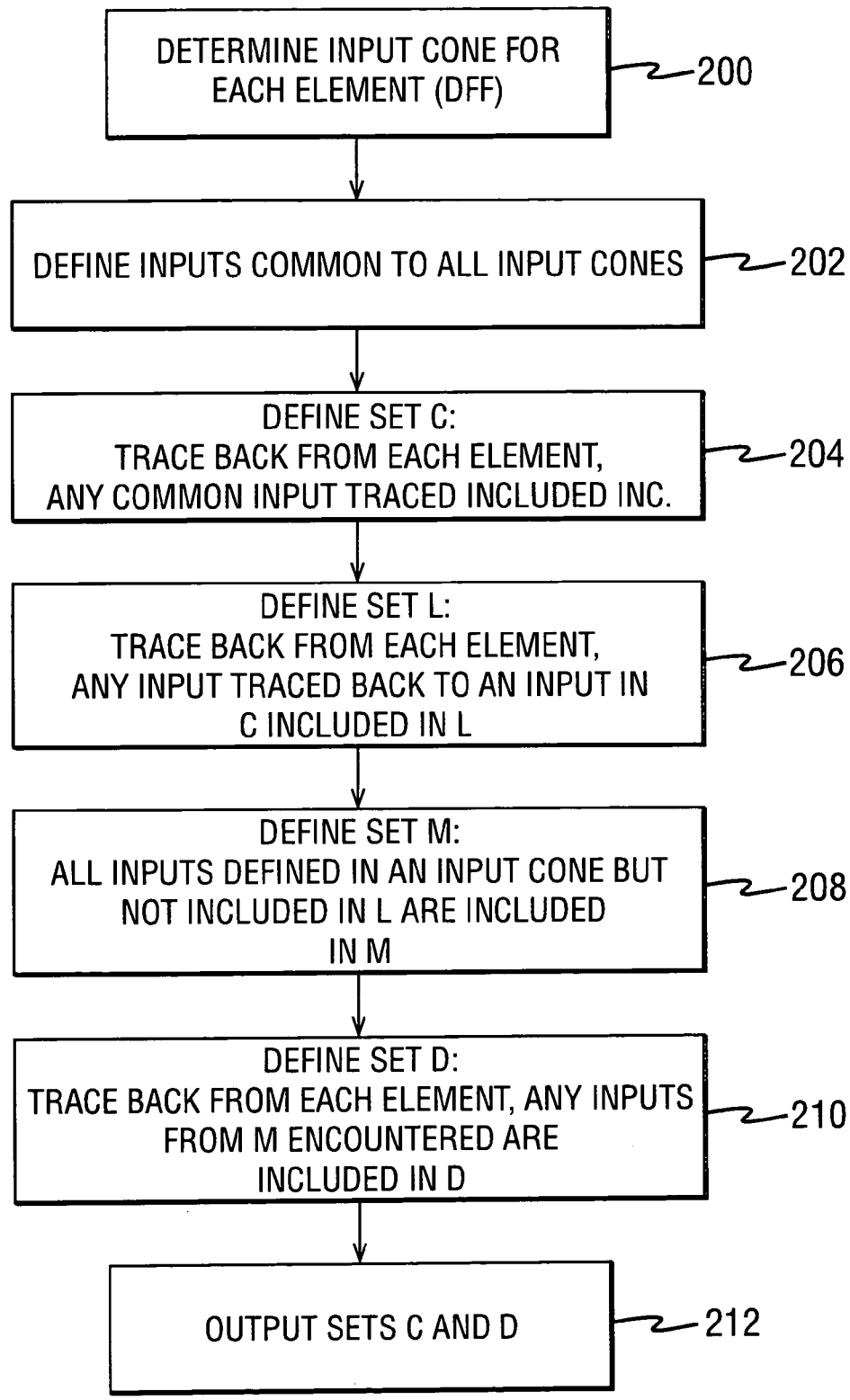
FIG. 14 is a flow chart illustrating a common set finding process in accordance with a preferred embodiment of the invention.

The steps performed in the algorithm are described in detail hereinbelow, with additional reference to FIG. 14 which illustrates the general preferred steps.

1. In a first step 200, represented in FIG. 3(a), for each member $DFF_i$ of the set S, the set $IC_i$ is determined. The set $IC_i$ is the input cone of the $DFF_i$. To find the input cone, a trace back is performed from the input of the DFF through the preceding gates. The maximum number of gates through which the trace back is performed is determined by the parameter SearchDepth. All the wires encountered in the trace back for each DFF are added to the set $IC_i$ for that DFF.

If any of the wires in the set $IC_i$ are driven by buffers or inverters, the wire in front of that buffer or inverter is also included in $IC_i$. This is repeated until the set $IC_i$ stops growing.

By way of example, with reference to FIG. 2, if SearchDepth=2, then $IC_1$={a,b,c,i,l}; $IC_2$={b,c,d,h,i,j,m}; and $IC_3$={b,c,g,h,i,k,n}.

As a result of this step, there is defined a number of input cone sets corresponding to the number of DFFs in the set S.

2. In a second step 202, a common input cone set is then defined. This set is defined as the intersection of all the sets $IC_i$, i.e. the wires common to all the input cones. Thus the common input cone set defines all those common elements of the individual input cone sets. This is illustrated in FIG. 3(b).

In the example in FIG. 2, then common={b,c,i}.

3. In a third step 204, the set C is defined. A trace back from all DFFs in S is again performed. In this trace back, any wires in the common input cone set are identified. When a wire in the common input cone set is found, it is included in the set C, and the trace back is terminated along that path. This prevents wires "inside" the common set being added to the set C. If the trace back finds a wire outside all of the input cones $IC_i$, i.e. which is not defined in any of the input cones sets, then again the trace back is terminated along that path. If the number of elements in C reaches the MaxCSize parameter, the trace back is terminated (in practice this does not often happen). FIG. 3(c) illustrates the results for an example when MaxCSize=7. The trace back (illustrated by the dotted line) has found seven points that have been added to C, and the search stops.

In the Example of FIG. 2, C={i}.

4. In a fourth step 206, a further trace back from all DFFs in set S is performed, tracing all paths back that reach a point defined in the set C. All wires identified on these paths are defined in a set L. This is represented by FIG. 3(d).

All wires that are in one of the sets $IC_i$ but not included in the set L are defined in another set M, represented by a fifth step 208. This is also represented by FIG. 3(d).

In the Example of FIG. 2, L={l,m,n}; and therefore M={a,b,c,d,g,h,i.j.k}.

5. In a sixth step 210, a trace back from each DFF is again performed in order to determine the set D. If a wire in C is encountered, then the trace back is stopped along that path. If a wire in M is encountered, that wire is added to the set D and the trace back is terminated along that path. This effectively makes D the set of elements that are on the "border" of L that are also not in C, as illustrated in FIG. 3(e).

In the example of FIG. 2, D={a,j,k}.

Thus, the use of the common set algorithm for the example of FIG. 2 results in the same results, as discussed above, which are obtained on a manual inspection of FIG. 2. For a more complicated arrangement than that of FIG. 2, the algorithm produces a near optimal result for sets C and D, which are output in a step 212.

After determination of the sets C and D by way of the common set algorithm, the next step in the gated synthesis function is to perform the netlist gating itself, i.e. the main step of the gated synthesis phase.

The netlist gating algorithm starts with a set S of DFFs. As above, S is composed of n elements $DFF_i$. The output of a $DFF_i$ is further denoted herein as $x_i$. The principle behind netlist gating is described with reference to FIG. 4. Each of the DFFs 802,804,806 generates an output on a respective output line 1002,1004,1006, denoted as $x_i$. Each of the DFFs receives a clock input on a clock signal line 1016. Each of the DFFs receives an input from a respective function $h_i$ 1008,1010,1012. The respective functions $h_i$ receive an input from the sets C and D as represented by line 1014, and from the output of the associated DFF.

The register is made up of the set S of DFFs. As illustrated in FIG. 4(a), the register has a number of functions $h_i$ creating the inputs to the respective DFFs, $DFF_i$, and these functions depend on wires in the sets C and D.

Every function $h_i$ also depends on $x_i$, the output from $DFF_i$, and as such a function G can be created which only depends on wires in C, and can be used as a clock gate function. G is used to simplify the functions hi, creating a corresponding set of functions $f_i$. This is represented by FIG. 4(b), in which the functions $h_i$ of FIG. 4(a) are replaced by a set of functions $f_i$, 1020,1022,1023. The functions $f_i$ 1020,1022,1024 form inputs to the respective DFFs 802, 804,806. The functions $f_i$ receive inputs only from the sets C and D on line 1014. The clock inputs to the DFFs 802,804,806 are supplied on line 1030, which is supplied by the clock line 1016 via a clock gate 1024. The clock gate 1024 is controlled by the output of the function G 1026, which in turn is dependent on the set C on line 1028.

The generation of the functions $f$, h and G is described in detail hereinbelow. For ease of reference in the following description, the following notational conveniences are used:

The notation $f( \ldots, x=0, \ldots )$ means the value of the function $f$ when its input x is replaced with zero.

The notation $\forall x.f$ means $[f( \ldots, x=0, \ldots ) \text{ AND } f( \ldots, x=1, \ldots )]$. This can be defined as the combinations of inputs that result in $f$ being true for all values that x can take.

The notation $\forall X.f$ where X is a set of inputs $x_1, x_2, \ldots x_n$ means $\forall x_1.\forall x_2 \ldots \forall x_n.f$ This is a function which defines when $f$ is true for all of the values that any input in X can take.

Figure 15:
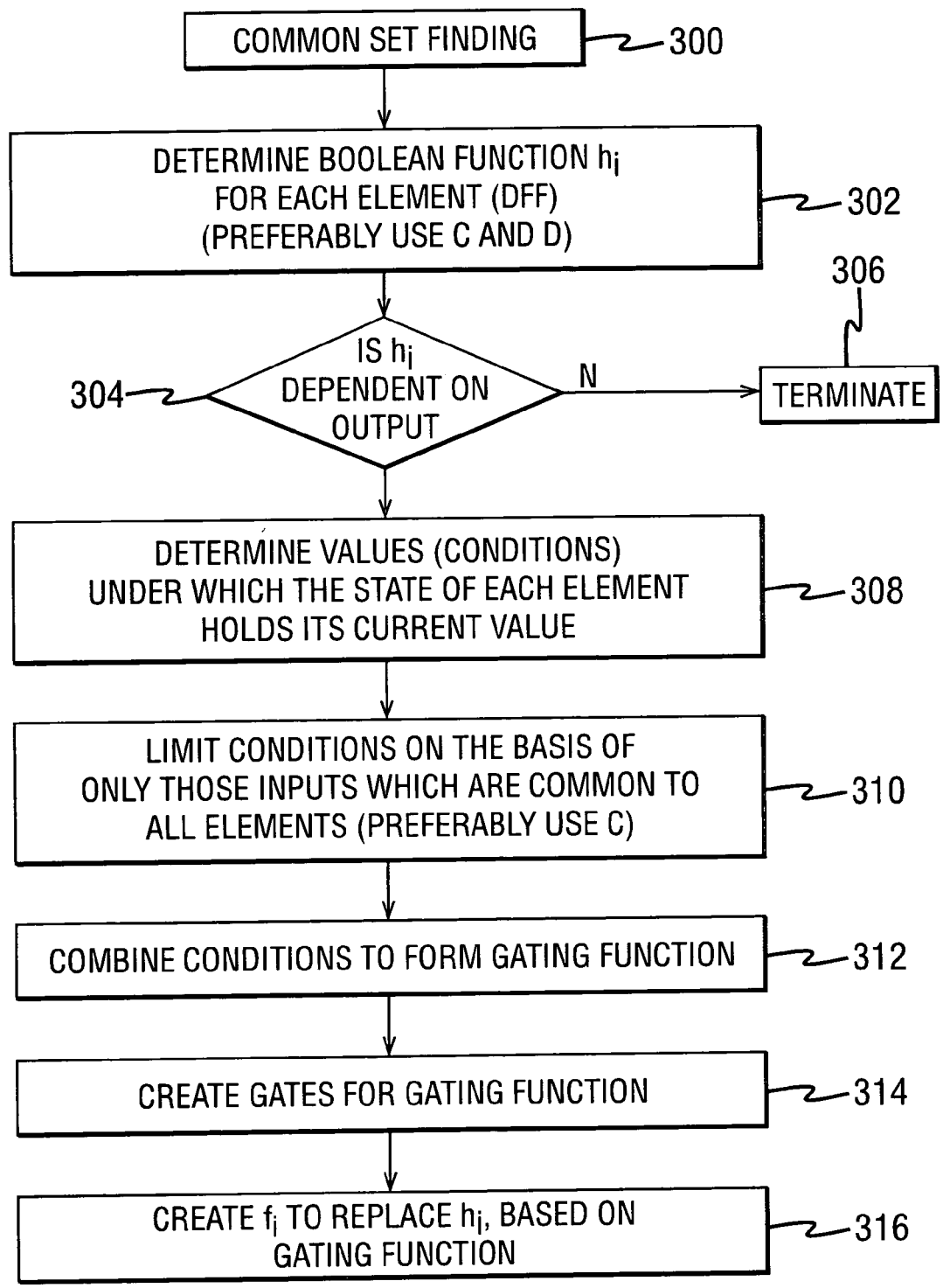
FIG. 15 is a flow diagram illustrating a netlist gating process in accordance with a preferred embodiment of the invention.

The Netlist gating algorithm is described hereafter, with additional reference to the flow diagram of FIG. 15 which illustrates the preferred general steps:

1. In a first step 300, preferably find the sets C and D using the common set finding algorithm as defined above.
2. In a second step 302, for each $DFF_i$ in the set S a boolean function $h_i$ is found that determines the input to the DFF, in terms of wires defined in the sets C and D only. Such a Boolean function must exist, by virtue of the definitions of C and D. The determination of this function based on C and D is preferable.
3. In a third step 304, it is checked to see whether the function defined in step 302 is dependent upon the output of the respective DFF, i.e. it is checked to see whether each of the functions $h_i$ depends on $x_i$. If any one does not, the algorithm is terminated in step 306, and netlist gating for that register is terminated.
4. In a fourth step 308, there is determined the conditions under which each register will hold its present value, and consequently for which there is no requirement to write to the register. For each $DFF_i$ in the set S, there is defined a value $writeb_i = h_i( \ldots, x_i=1, \ldots )$ AND NOT $[h_i( \ldots, x_i=0, \ldots )]$. The parameter $writeb_i$ defines the conditions under which a $DFF_i$ holds its present value. It is a write-bar condition, such that if $writeb_i$ is true, the register will not be written to. This step is therefore preferably dependent upon the function determined in the step 302.
5. In a fifth step 310, for each $DFF_i$ in the set S, there is defined a value $qwriteb_i = \forall D.writeb_i$. This quantified write-bar signal also defines the conditions under which a DFF will not change its value, but this parameter only depends on wires in C, which are common to all DFFs in S. Its meaning is "if the wires in C satisfy this Boolean condition, then $DFF_i$ will not be written". Thus this step eliminates the set D from the results of step 4.
6. In a sixth step 312, a parameter G=NOT ($qwriteb_1$ AND $qwriteb_2$ AND ... AND $qwriteb_n$) is defined. This parameter defines the conditions on C under which no DFF in S will be written to.
7. In a seventh step 314, a technology map is prepared. Preparing a technology map involves taking a logical expression and creating a circuit consisting of gates from a standard cell library that implement that expression. In this step Techmap G (this is a standard technique) is used to create gates in the netlist that compute G, and then add a tag to all DFFs in S that effectively say "this register is gated by the function G".
8. In an eighth step 316, for each hi in turn, a function $f_i$ is created which agrees with $h_i$ when G=1. Standard algorithms exist to do this, such as creating a Karnaugh map with entries $h_i$ when G=1 and X when G=0, and invoking standard synthesis algorithms. If the gates to produce $f_i$ are smaller than the gates that produce $h_i$, then $h_i$ is replaced with $f_i$ otherwise $h_i$ is left in the circuit.

Following this algorithm, the netlist generation is complete. Thus the netlist generation step results in the generation of:

a) A function G which defines, for a register or set of elements, the conditions under which it should be clocked; and b) A function $h_i$ or $f_i$ which defines, for each clocked state-element of the register, the input logic to the gate.

It should be noted, therefore, that certain ones of the functions $f_i$ of FIG. 4(b) may in fact be functions $h_i$.

After the Netlist gating step as described above, forced gating is carried out as the final stage of the gated synthesis phase.

Forced gating is effectively the principle of gating small groups of DFFs in the design individually. This applies to any grouping of DFFs, not just registers in the RTL as currently-available tools do. The principle of forced gating is to compare the outputs of a small set of DFFs with their respective inputs, and if they are the same, the clock is disabled for that set of DFFs.

The basic idea of forced gating is to group together at least part of an RTL register in a chunk, and then apply a comparison between the inputs and outputs to decide whether to turn off the clock to this chunk. FIG. 5 shows the principle of forced gating.

In FIG. 5(a), there is illustrated a set of DFFs 1102,1104, 1106. Each DFF receives an input on a respective input line 1108,1110,1112 and generates an output on a respective output line 1114,1116,1118. Each DFF is clocked by a clock signal on line 1120. In implementing forced gating, as shown in FIG. 5(a) a comparator block 1122 is introduced, the output of which controls a clock gate 1124. The clock gate 1124 receives the clock signal on line 1120, and provides the clock signal on line 1126 to the clock inputs of the DFFs under the control of the output of the comparator block 1122.

The comparator block receives as its inputs the inputs 1108,1110,1112 to the DFFs and the outputs 1114,1116,1118 from the DFFs. The design and implementation of the comparator block in order to implement forced gating is described further hereinbelow.

Bearing in mind the requirement that the advantage of forced gating is that the clock can be gated to prevent clocking when the output of a DFF—or chunk of DFFs—does not change, three types of comparisons may be implemented in the comparator block:

1. A simple input and output comparison, such that the DFFs are turned off when the input and output are both the same. In implementation, this requires an XOR gate, which may typically have an area of 8 units and take proportionally more power than a smaller gate. This turns the chunk of DFFs off (i.e. prevents them clocking) when the input and output are both at either logic zero or logic one.
2. The chunk of DFFs can be turned off when only the input and output are both at logic zero. This requires an OR gate, which has an area of 4 units, and takes approximately half the power of an XOR gate.
3. The chunk of DFFs can be turned off when the input and output are both at logic one only. This requires a NAND gate, with an area of 3 units and consumes the least power out of the three options.

In the preferred embodiment, the comparator block does a distinct comparison for each DFF of the chunk, and logically ANDs the results all together, so the different types of comparisons can be mixed inside one comparator block. Thus, turning again to the example of FIG. 5(*b*) the comparator block may include an appropriate gate for each of the DFFs in the chunk shown, and then the outputs of each of those gates is preferably connected to an AND gate or a combination of gates which duplicates the effect of a tree of AND gates, the output of which form the output of the comparator controlling the clock gate.

It is clear that an XOR comparison will turn the clock off at least as much as either an OR or a NAND gate, so will save at least as much power, but it will consume more power itself. A trade-off is therefore required between the three different types of comparison, and the option of doing nothing at all. The best choice depends on how the DFF is used in a typical application of the circuit, and not on the circuit itself.

Thus in implementing forced gating, a first choice is made for each DFF between implementing an XOR gate, an OR gate, a NAND gate, or no gate.

A second choice that needs to be made is the size of the chunk to use, i.e. the number of DFFs to be grouped with a comparator block. A chunk size of 1, i.e. one compare function for each DFF, saves the most power but consumes the most power in the clock gating blocks. A larger chunk size trades off a small amount of the benefits against a lower cost of providing those benefits. In practice, the best chunk size may be between two and eight. The chunk size affects the types of comparison that are used in the comparator block.

A third choice is whether half-cycle or full-cycle gating is employed in the clock gate 1124 of FIG. 5(*b*). The algorithm described below for forced clock gating does not specifically make this choice directly, but this choice does affect the chunk size and hence the types of comparison. The algorithm is therefore preferably run twice, once to make decisions assuming half-cycle gating, and once assuming full-cycle gating. However this is only necessary in implementations where a choice between full and half cycle gating is offered.

In the preferred embodiment, the result of the forced gating algorithm is two gating expressions for every DFF—one half-cycle gating expression, and one full-cycle gating expression. One or other of these expressions is used, the determination of which is made separately, as discussed further hereinbelow.

In order to be successfully implemented, the forced gating algorithm requires a scoring function. For a DFF in the circuit, this scoring function takes a chunk size, a gating type (half/full) and a comparison type (XOR, OR, NAND), and returns a measure of how much power would be saved by gating based upon that comparison type, i.e. a performance measurement, taking into account the way in which that DFF is used, which is derived from actual simulation data. A parameter for the scoring function may be called AreaPain, which creates a negative bias for anything that adds area to the circuit, proportional to the area it adds. This is a key feature of the algorithm—increasing AreaPain directs the algorithm to make a smaller circuit at the expense of a slightly decreased power gain.

The key innovation of this algorithm is how the choices between chunk size, gating type (full or half) and comparison type are made. The implementation of the scoring function is outside the scope of the present invention, and the implementation of such a scoring function will be within the scope of one skilled in the art. The important aspect of the scoring functions is that there is provided some basis for comparing the simulation results for the various combinations of chunk size and gate type for both full and half cycle gating.

The scoring is preferably constructed such that a score of less than zero means that the forced gating comparator is not worth implementing. Preferably, doing no comparison has a score of zero.

Figure 16:
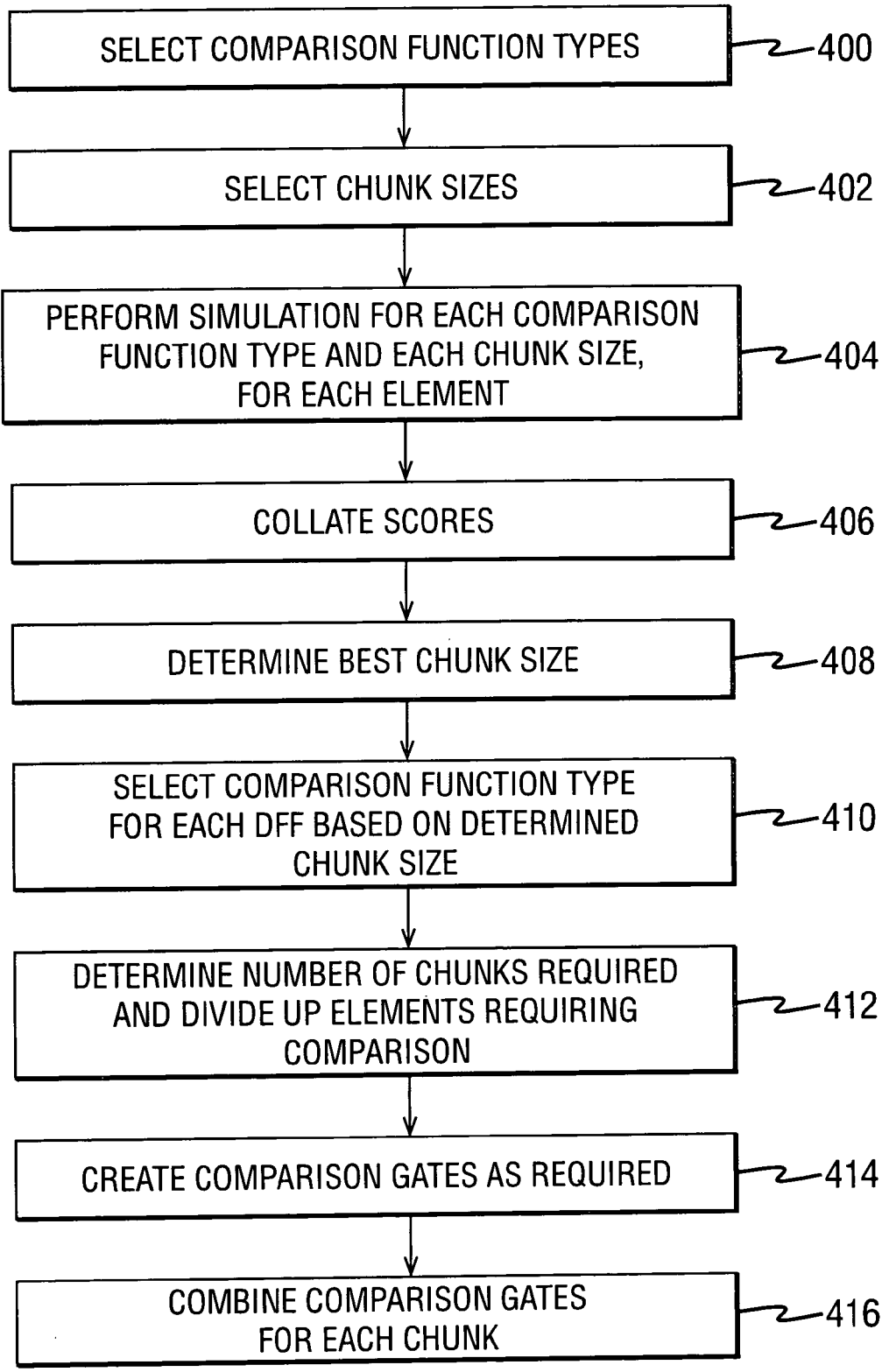
FIG. 16 is a flow diagram illustrating a forced gating process in accordance with a preferred embodiment of the invention.
Figure 17:
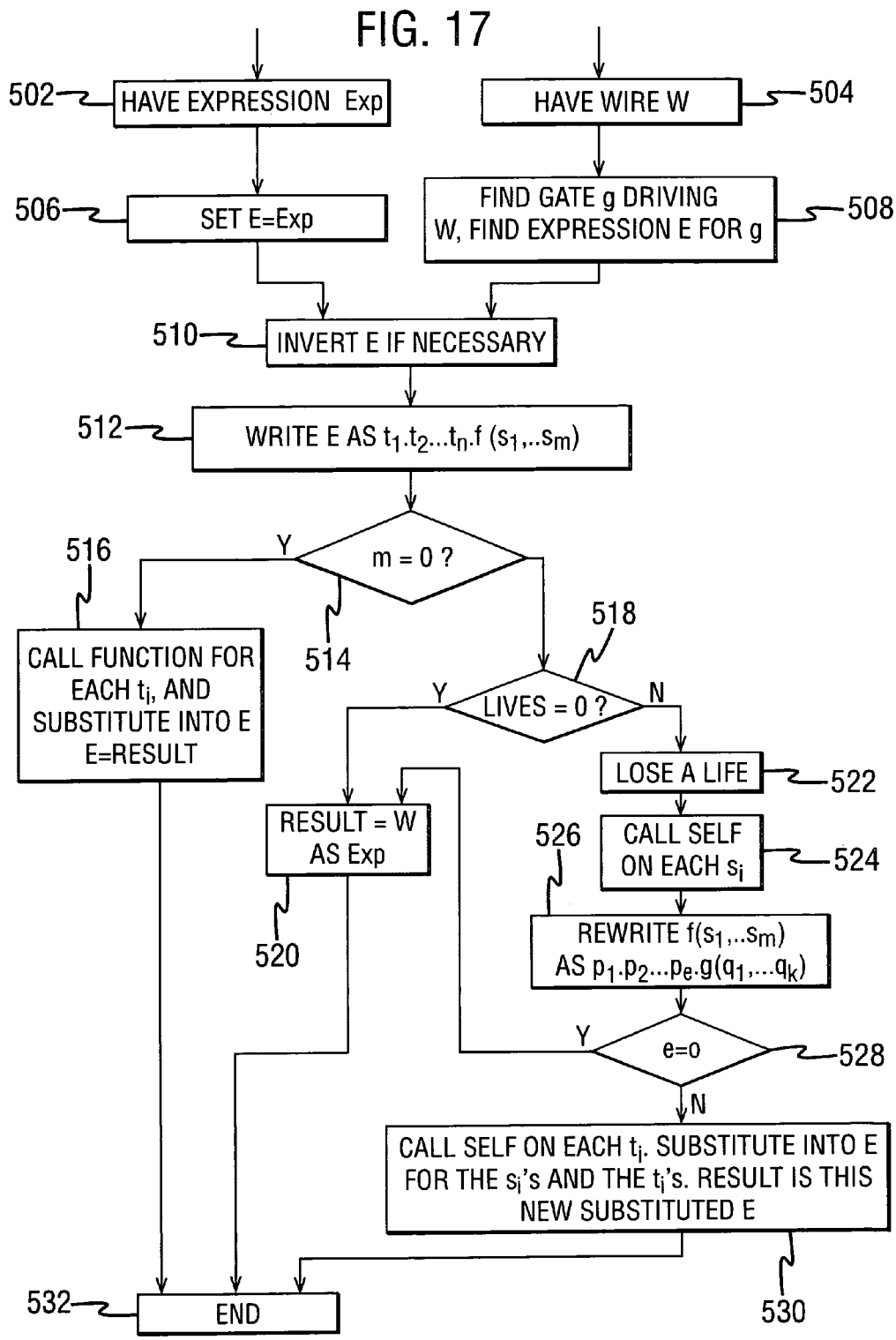
FIG. 17 is a flow diagram illustrating an optimal expression process in accordance with a preferred embodiment of the invention

The algorithm works on a set S of DFFs that constitute a register in the RTL, as for the netlist gating described above, and is as defined below. It should be noted that the algorithm is performed twice: once for half-cycle gating and once for full cycle gating. For the purpose of this example it is assumed that the half-cycle gating analysis is performed first. Reference is additionally made to the flow diagram of FIG. 16. In preliminary steps 400 and 402, the different compassion types and chunk or group sizes to be considered are selected.

1. In a step 404, a score is found for every DFF in S in the case where the chunk size is 1, 2, 4 or 8 and the comparison type is XOR, OR, NAND (12 scores in total: four for chunk sizes time three for comparison types). The scores are collated for analysis in a step 406.
2. In a step 408, the best chunk size is determined. For each chunk size 1, 2, 4 or 8, in turn, the best comparison type for each DFF is picked individually. The scores for the best comparison type for each DFF are then added. This gives a total score for each of the four chunk sizes. The best chunk size according to highest of the four total scores is then picked.
3. In a step 410, the comparison type of each DFF is determined. Now the best chunk size is known, the highest-scoring comparison type for each individual DFF is selected. A score of o for not doing anything may well be the highest score for some, if not all, of the DFFs.

4. In a step 412, the DFFs in the set S have a score above zero are put in a new set T. It is assumed there are m DFFs in T, which is likely to be less than the size n of S. A parameter ceiling(m/chunk size) is then found, which is the number of chunks required. (The mathematical operator ceiling means "round up the fractional part"). The set T is then divided into the required number of chunks such that each chunk is as equal in size as possible.

5. In a step 414, for each DFF in T, a comparison gate is created, i.e. an XOR, OR or NAND gate as appropriate given the highest score for that DFF.

6. In a step 416, for each chunk determined in step 4, the outputs of the comparison gates are ANDed together. This provides a clock gating expression for each of the DFFs in that chunk.

After the above steps are performed on the basis of a half cycle gate, they are repeated assuming a full-cycle gate.

This gives a pair of gating expressions, one half-cycle and one full-cycle, for each chunk. As discussed in relation to FIG. 5(b), one of these pairs of gating expressions is for implementation in the comparator block 1122.

These pairs of gating expressions are termed partially determined gating expressions, and are resolved into fully determined gating expressions in a later stage, discussed hereinbelow. Each DFF is associated with a pair of such expressions, each DFF associated with the same chunk having the same pair of expressions.

The half-cycle and full-cycle chunk sizes may be widely different, which is why the algorithm given above saves more power than an approach where a constant chunk size is used.

The forced gating stage completes the gated synthesis phase of operation. In summary, the gated synthesis phase of operation has resulted in generating the following:

a) A function $h_i$ or $f_i$ which defines, for each clocked state-element of the register, the input logic to the gate.
b) A function G which defines, for a register, the conditions under which it should be clocked; and
c) A pair of gating expressions $g_{iH}, g_{iF}$ (one half-cycle, one full-cycle) for each DFF, for controlling the clock gate associated with the DFF.

In a second phase, hierarchical gating is performed based on these results from the gated synthesis phase. The hierarchical gating preferably uses a maximal conjunctive forms (MCF) function, an aggressive half-cycle gating (AHCG) function and a gating precedence function to further process this information from the first phase. The purpose of the hierarchical gating phase is to produce a clock gating structure which is tiered or hierarchical.

Figure 6:
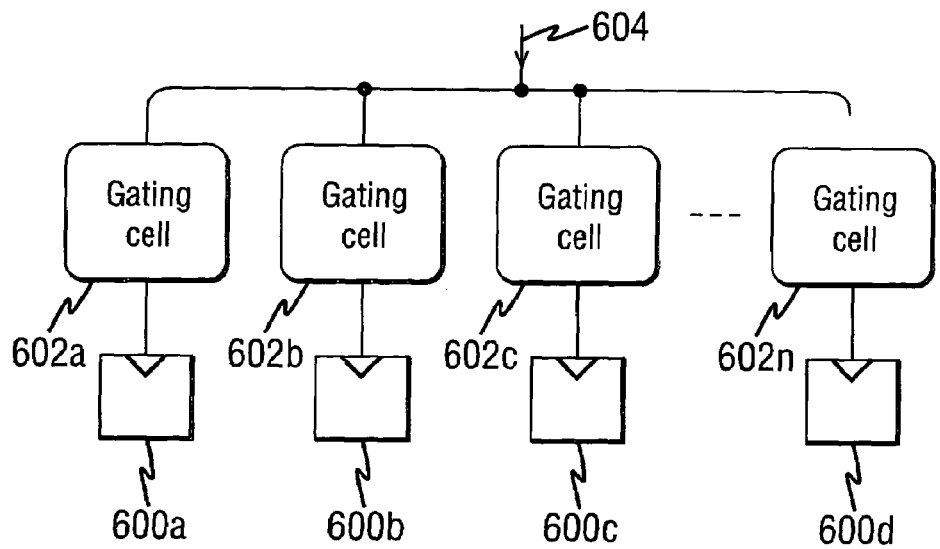
FIG. 6 illustrates a flat clock gating structure.

Currently, automatic tools for clock gating produce single level clock gating structures, as shown in FIG. 6. In such a structure a set of DFFs 600a to 600d receive clock inputs from a set of clock gating cells 602a to 602d, each of which receives a clock signal on line 604. Such a single-level structure has a predetermined type of gating, which because of the timing problems with half-cycle gating, in practice is always full-cycle.

Figure 7:
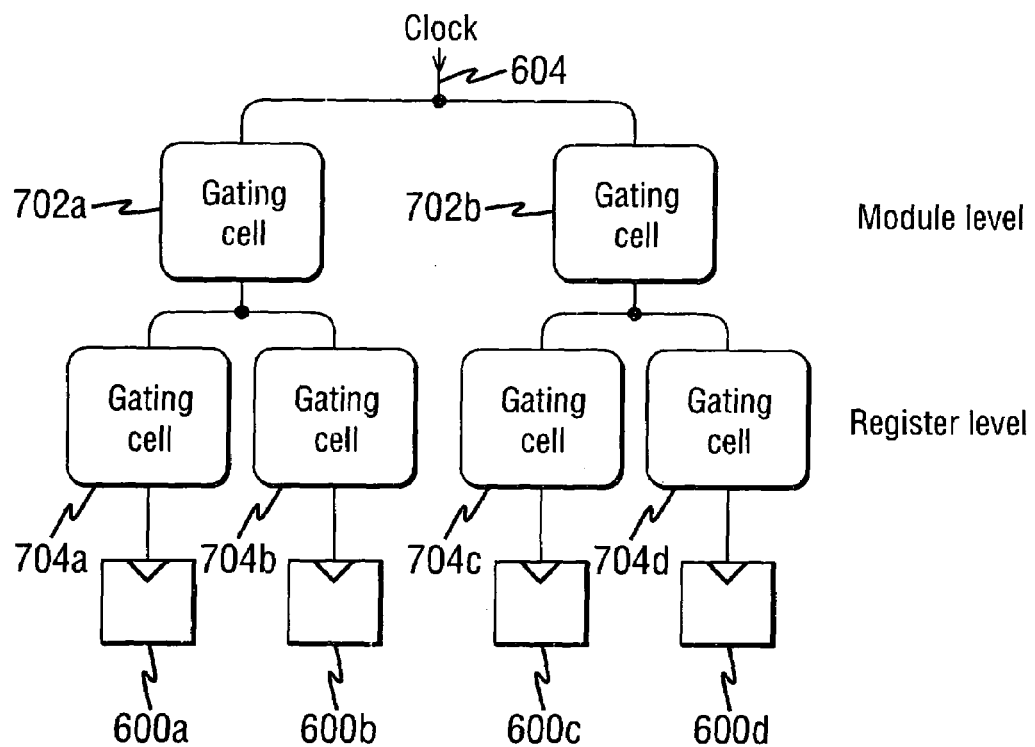
FIG. 7 illustrates a hierarchical clock gating structure in accordance with a preferred embodiment of the present invention.

In accordance with preferred embodiments of the present invention, half-cycle and full-cycle gating can be combined in a hierarchical clock gating structure. A hierarchical clock gating structure is illustrated in FIG. 7. In FIG. 7 the set of DFFs 600a to 600d each receive a clock signal from a respective gating cell 704a to 704d in a second tier of a gating structure. The gating cells 704a and 704b receive a clock signal from a gating cell 702a in a first tier of a gating structure. The gating cells 704c and 704d receive a clock signal from a gating cell 702b in a first tier of the gating structure. The gating cells 702a and 702b receive the clock signal on line 604. As discussed further hereinbelow, in a preferred embodiment gating expressions are split into conjunctive forms to maximize the possibilities of sharing gating logic between different registers, with the proviso that certain rules are followed. The use of a hierarchical clock gating structure in accordance with embodiments of the invention is particularly advantageous and can reduce the power consumed by a circuit by 30% compared to standard single level clock gating.

In the preferred embodiment described herein, the implementation of a hierarchical structure is brought about by three preferred algorithms in three distinct phases, as discussed in detail hereinbelow.

Maximal conjunctive forms (MCFs) are created by a first algorithm. The purpose of the maximal conjunctive form algorithm is to generate an improved expression for the gating function G generated in the gated synthesis phase. This is an improved expression for the gating expressions determined in the netlist gating stage. The objective of the MCF algorithm is described further hereinbelow, from which it will be apparent that the expression generated in the forced gating stage is not processed using the maximal conjunctive forms algorithm.

When using a single level of gating as illustrated in FIG. 6, only one gating expression is required for each DFF, as a single gating cell controls a respective single DFF. When hierarchical gating is to be used, as illustrated by FIG. 7, it is optimal to identify as many gating expressions as possible which are common to a given DFF, which may then be used by a hierarchical gating algorithm to give more scope to save power. As illustrated in FIG. 7, in a hierarchical gating structure each DFF may be associated with a plurality of gating cells, and consequently with a plurality of gating expressions.

The purpose of the MCF algorithm, in the preferred embodiments of the present invention, is to process the gating expression G to provide for an improved gating structure.

The input to this MCF algorithm is the set of gating expressions G, each corresponding to a set S of DFFs, created by the gated synthesis algorithms in the first phase.

Some standard definitions are first explained, which definitions are well-known in the art and not specific to the invention.

A conjunction is when a set of Boolean quantities are ANDed together, so if A, B, C and D are Boolean quantities, then (A AND B AND (C OR D)) is a conjunction. In particular, it is a conjunction of three terms: A, B and (C OR D).

A conjunctive form is simply writing an expression as a conjunction. Typically, the Boolean AND operator is written as a dot, and OR is written as a plus sign. Hence the above expression could be written "A.B.(C+D)".

The input to the maximal conjunctive form (MCF) algorithm is a gating expression generally referred to herein as G, which is a Boolean function of wires in the netlist. The output of the algorithm is an alternative expression for G, termed G', which may be defined in terms of different wires in the netlist. The aim of the algorithm is to find a "good" expression for G', with the following two constraints:

A large number of terms in the conjunctive form is good, because this gives a hierarchical gating algorithm more scope.

A large expression is bad, because this expression has to be re-synthesised at some point, and general-purpose synthesis algorithms tend to perform poorly on large expressions.

This gives an imprecise definition of good, so the algorithm needs to be heuristic. For example:
1. A.B.C.D.E is very good—small expression, and relatively many (five) terms.
2. A.B.(C+D).E is good—small expression, and relatively not so many terms (only four).
3. A.B.(C+D).(E+F.G.(H+I))) is not so good—only four terms, but a large expression.
4. (A+B.(C+D)).(E+F.G.(H+I))) is bad—only two terms, but a large expression.

The circuit of FIG. 9 represents an example of a circuit which forms an input to a clock gate, fully traced back to the preceding DFFs.

FIG. 9 shows an example of a plurality of DFFs 1302 to 1316, labeled a to h. The output of DFF 1302 forms a first input to AND gate 1318. The output of DFF 1304 forms a second input to AND gate 1318, and to a buffer 1326. The output of DFF 1304 forms a first input to NOR gate 1322 via a series of buffer 1326 and inverter gates 1328 and 1330. The output of DFF 1306 also forms a second input to NOR Gate 1322 via inverter gate 1324. The outputs of AND gate 1318 and NOR gate 1322 form inputs to an OR gate 1320. The outputs of DFFs 1308 and 1310 form inputs to a NOR gate 1332. The outputs of DFFs 1312 and 1314 form inputs to NAND gate 1336. The output of NAND gate 1336 forms a first input to NAND gate 1338, and the output of DFF 1316 forms a second input to NAND gate 1338. A NAND gate 1334 receives as inputs the output of OR gate 1320, the output of NOR gate 1332, and the output of NAND gate 1338.

The wire at the output of gate 1318 is labeled $\alpha$ the wire at the output of gate 1322 is labeled $\beta$, the wire at the output of gate 1332 is labeled $\gamma$, the wire at the output of gate 1338 is labeled $\delta$, and the wire at the output of gate 1334 is labeled 107.

Thus, the circuit of FIG. 9 represents the full input cone to a gate, fully traced back to the DFFs which generate all the input signals to a DFF. As discussed hereinabove in relation to FIG. 2, the netlist function includes a pre-algorithm—the common set finding sub-algorithm—which selectively determines the ones of the connections which are used in the netlist algorithm, in order to make the implementation of the netlist algorithm practical. As discussed hereinabove, the netlist algorithm preferably generates a function $f_i$ which represents the input to a $DFF_i$, and which therefore represents the gating logic shown in FIG. 9.

FIG. 9 gives an example of a problem associated with determining the netlist gating algorithm. As discussed hereinabove in relation to a preferred embodiment, in tracing back the path of the inputs to a given DFF, certain input lines are not traced, based on the trace-back limitations of the algorithm. This can introduce certain problems.

Referring to FIG. 9, given a gating expression, G, for which is G=~107, the netlist gating algorithm is required to search or trace back through the logic creating 107, rewriting G as functions of different wires in the netlist. If this procedure gives an expression such as described with reference to heuristic 1 above, then such results are satisfactory.

If, however, it comes up with a result consistent with heuristic 4 above it would have been better simply to have left the expression as ~107. There are obviously grey areas in between, where it is best to trace part-way back through the gates driving 107.

In tracing back, given the need for a function such as the common set algorithm for providing a simplified input, a more efficient expression may not be identified.

Two end-cases are of special interest in relation to the MCF algorithm:
  Given a gating expression G, the MCF algorithm can do nothing and simply returns this expression. This must happen if all the terms in the original expression for G are the direct outputs of DFFs in the design. This would give a minimal number of terms.
  The algorithm may expand every term in the expression for G until G is a function of DFFs in the design only. This would give a maximal number of terms in the expression for G, but the expression would be huge.

It is worth noting that each of these end-cases is a permissible result, although in general both end-cases produce poor results. The MCF algorithm can be viewed as finding the best compromise between two poor end-case results.

FIG. 8 shows three example circuits with the results that should be produced from the MCF algorithm.

In FIG. 8(a), inputs a and b are provided to an AND gate 1202, the output of which forms a first input to an AND gate 1204. A second input c forms a second input to the AND gate 1204. The AND gate 1204 produces an output x. It is easy to see in the example of FIG. 8(a) that x should be represented as a.b.c.

In FIG. 8(b), inputs a and b are provided to an AND gate 1206, the output of which forms a first input to a NAND gate 1208. A second input c forms a second input to the NAND gate 1208. The NAND gate produces an output y. In this example ~y is required, and it is easy to see that ~y is a.b.c.

In FIG. 8(c), inputs a and b are provided to a NAND gate 1210, the output of which forms a first input to a NOR gate 1212. A second input c forms a second input to the NOR gate 1212. The NOR gate 1212 produces an output z. This example shows that AND gate functions do not necessarily correspond to physical AND or NAND gates—here a NOR gate performs an AND function, with z being a.b.(~c).

FIG. 9 clearly shows a more difficult example, where a simplified expression for ~w is not so apparent. An expression for ~107 is required. The difficulty is identifying that the DFF 1304 appears on two branches, so it is worth tracing back as far as the DFF 1304 in that case. However it is not worth tracing back as far as the DFFs 1312,1314 and 1316 because they do not create conjunctions in the final result. If a possible algorithm did not trace back to DFF 1304, it would find the result $(\alpha+\beta).(\sim d).(\sim e).\delta$ which is only four terms. If an algorithm did trace back to DFF 1304, it would find $b.(\alpha+c).(\sim d).(\sim e).\delta$, which is five terms. In the particular example that this is taken from, the four-term result would give a significantly worse outcome overall.

The maximal conjunctive form algorithm, in accordance with a preferred embodiment of the present invention, is described in detail hereinbelow, and operates for the purpose of providing improved hierarchical gating.

The algorithm, internally, is recursive, and operates on wires in the netlist—that is, it takes a wire as a parameter and may call itself with other wires in the netlist in the course of calculating a result. To find a good conjunctive form for a wire w, the algorithm looks at the gate that drives that wire, which can be considered as a Boolean function of other wires $o107_1$, $o107_2$ ... in the netlist. If that Boolean function satisfies certain criteria, the algorithm will call itself to find good conjunctive forms for $o107_1$, $o107_2$, ... and then stitch these conjunctive forms together to produce a good conjunctive form for the original wire 107.

However, the Netlist Gating algorithm produces an expression as its output, not a single variable (i.e. a wire). The MCF algorithm cannot operate directly on an expression—it operates on variables. A simple modification to the first pass of the algorithm solves this problem, however, when G is an expression. Instead of looking at the netlist to find an expression for w in terms of wires $o107_1$, $o107_2$, . . . the expression created by the netlist gating algorithm, G, is considered to already be an expression in terms of $o107_1$, $o107_2$, . . . which solves the problem. Effectively, the first step of the algorithm may be considered as already completed (that is, finding an expression for the wire 107), so that the first step is bypassed. This will become further apparent with reference to the detailed description of the algorithm below.

Overall, the MCF algorithm:
Takes a wire 107 in the netlist, or an expression involving wires in the netlist, each of which constitutes G, and forming an input to a clock gating element;
Considers whether this wire or expression is required inverted or not;
Provides a "life counter", which preferably starts at one. When a negative action occurs (discussed further hreinbelow), a life is lost, and when there are no lives left, the algorithm stops. This prevents the algorithm scanning back too far.
Produces a Boolean expression G' in terms of wires in the netlist, logically equivalent to the input wire or expression G to a clocked gating element.

The algorithm is recursive, so will call itself at various points. The algorithm always calls itself with a wire, not with an expression.

Note that in the description below, the terms "Boolean function" and "Boolean expression" are synonymous. The Maximal conjunctive form algorithm is defined as follows:
1. The first step of the algorithm depends on whether G is a single variable (i.e. a wire) or an expression.
   a) If the input is a variable (wire), then in a step 504 a gate g is found in the netlist that drives the wire 107. If g is a DFF or other state-holding gate, return the expression consisting of the single term w.
      If g is not a DFF, then in step 508 the Boolean expression E for the gate g is found that describes the output function in terms of g's inputs.
   b) If the input is an expression, then in steps 502 and 506 this expression is set to be E.
   In the example of FIG. 9, none of the gates directly driving the DFF are DFFs themselves.
2. In a step 510, if the variable or expression is required inverted, then E is set=~E.
   In FIG. 9, for the gate 1334, this would give $\sim E=(\alpha+\beta).\gamma.\delta$, because the gate's function is $\sim((\alpha+\beta).\gamma.\delta)$ but the wire is required inverted.
3. In a step 512, all variables that are used in E are found. These variables are divided into a set $T=\{t_1, \ldots t_n\}$ of variables such that $(t_i.E)=0$ or $(\sim t_i.E)=0$, and a set $S\{s_1, \ldots s_m\}$ of the rest. Either of n and m can be zero if that set is empty.
   (What this effectively means is that T are variables that can force the output to 0, and S are the ones that cannot. In the expression $(\alpha+\beta).\gamma.\delta$, setting either $\gamma$ or $\delta$ to zero forces the whole expression to zero, so $\gamma$ and $\delta$ are in T. The variables $\alpha$ and $\beta$ cannot force the expression to zero, so they are placed in S).
   E is now of the form $t_1.t_2 \ldots t_n.f(s_1, \ldots, s_m)$ where $f$ is some function.

In FIG. 9, $t_1=\gamma$, $t_2=\delta$, and n=2, $s_1=\alpha$, $s_2=\beta$, and m=2, $E=(\alpha+\beta).\gamma.\delta$, so $f(s_1,s_2)=s_1+s_2$ and $E=t_1.t_2.f(s_1,s_2)$ 4. If m=0, then in a step 514 the gate is effectively an AND gate. This algorithm is therefore called recursively to find expressions for each of $t_1, \ldots t_n$. then substitute these expressions in to E return a new value of E. When calling the algorithm recursively on $t_i$, the inversion of the wire depends on whether $(t_i.E)=0$ or $(\sim t_i.E)=0$; the latter requires it to be inverted.
5. If m≠0 and number of lives=0 in step 518, then the single term 107 is returned in step 520. Thereafter the algorithm ends in step 532.
6. If m≠0 and number of lives >0, then a life is lost in step 522. This algorithm is recalled recursively on each of the $s_i$'s in step 524, and these results are substituted into the function $f$. In step 526 the function $f$ can now be written as $p_1.p_2 \ldots p_l.g(q_1, \ldots q_k)$ as in step 512 above where g( ) is another function, and as above one of l and k can be zero.
   a) If l=0 in step 528, the single term 107 is returned in step 520, and the algorithm ends in step 532.
   b) Otherwise, in step 530 recursively call this algorithm (remembering that the number of lives is now one lower) to find expressions for each of the $t_i$'s. These expressions are substituted into E, and also substituted in $f$ as $p_1.p_2 \ldots p_l.g(q_1, \ldots q_m)$ as in step 6. This new expression is returned for E. The algorithm ends in step 532.

In the example in FIG. 9 at step 6, $f$ becomes $b.(\alpha+c)$ so l=1 and m=2. The value of l is not zero, so the algorithm enters step 6(b). The expression for $t_1$ is $(\sim d).(\sim e)$, and $t_2$ is $\delta$, so the final expression returned is $(\sim d).(\sim e).\delta.b.(\alpha+c)$.

Thus, the purpose of the maximal conjunctive form algorithm is to generate improved expressions for the gating functions generated in the gated synthesis phase. These are improved expressions for the gating expression determined in the netlist gating stage. The expressions generated in forced gating stage are not processed in the maximal conjunctive forms stage. This step may generate more than one gating expression for each gating expression processed.

As discussed above in relation to netlist gating, the gating expression G comprises a number of terms. The MCF algorithm similarly provides an improved gating expression G' which comprises a number of terms.

A second preferred stage of the hierarchical gating phase is termed aggressive half-cycle gating (AHCG). The AHCG stage consists of running a timing analyzer on the circuit to determine when the various gating expressions are available. If an expression is available in half a clock period or less, it can be used in a half-cycle gate. Otherwise, it is used in a full-cycle gate. This expression thus exploits a feature of a preferred embodiment, namely the use of a circuit design which includes mixed half-cycle and full-cycle gates.

This stage thus optimizes circuit design by using the half-cycle gating where it is practical to do so.

This algorithm determines, given a particular opportunity for gating the clock to a register, whether to use a half-cycle or full-cycle gate. A half-cycle gate is always preferable to a full-cycle gate if it meets the appropriate timing criteria. There is an advantage to half-cycle gating that is not well understood. Full-cycle gating brings the clock line low when the register is unused, so the first transparent latch in each DFF is in the transparent state. Any changes on the D inputs cause internal switching power in the DFF, and this power can be about the same as the power taken to clock the register—a large overhead. Half-cycle gating brings the clock line high when the register is unused, turning the first latch of each DFF opaque. This prevents any changes on the D input having any effect on the internal DFF state, which saves significant power over and above the clock gating benefits.

The inputs to the AHCG stage are PDGEs (Partially-Determined Gating Expressions). These expressions are so-called because, in this preferred embodiment, the algorithms in the gated synthesis stage (i.e. the netlist gating algorithm and the forced gating algorithm) may know that it is preferable to clock the gate in different ways based upon whether a half-cycle gate is available, but the information about whether that half-cycle gate really can be implemented is not computed at this stage.

To avoid making a wrong decision, the forced gating algorithm, as discussed above, effectively generates pairs of expressions, such that one can be used if a half-cycle gate can be used, or the other can be used if a full-cycle gate can be used.

The AHCG algorithm preferably also operates on other gating expressions, even if such expression has been associated with only a full-cycle gate, to determine if a half-cycle gate may be used instead.

The principle of the AHCG algorithm is described further hereinafter. There are four different types of PDGEs at the input to the AHCG stage, as summarized hereinafter:
1. A half-cycle gating expression from original the input netlist (i.e. which was stripped in the initial phase);
2. A full-cycle gating expression from the original input netlist (i.e. which was stripped in the initial phase);
3. A gating expression that has been found in the netlist gating stage, but it is not known yet whether it will meet half-cycle timing or not; and
4. A pair of gating expressions, a hopeful half-cycle gate and a backup full-cycle gate, that have been found in the forced gating stage.

The third and fourth types of gating expressions are thus available in preferred embodiments of the present invention, where netlist gating and forced gating respectively are implemented.

The aggressive half-cycle gating algorithm determines what to do with each of the above four cases, and consequently turns every PDGE into an FDGE (fully determined gating expression). An FDGE is an expression, and a label identifying whether the expression is a half-cycle gate or full-cycle gate, so in some sense a FDGE corresponds to case 1 or 2 above.

The AHCG algorithm performs different actions on each of the four conditions set out above. A half-cycle cut-off is defined, which would be typically 45% of the cycle time of the netlist, but is user-configurable. A full-cycle cut-off is similarly defined as typically 95% of the cycle time. The AHCG algorithm performs these actions of each of the four cases above, as discussed below:
1. Any expression in the first case is left alone—as it was safe in the existing netlist, it must also be safe now.
2. For expressions in the second case, the algorithm checks how early the expression is available. If it is available within the half-cycle cut-off time, and the user has allowed this kind of optimization, then the expression is promoted to a half-cycle gate. Otherwise, the expression is left as a full-cycle gate.
3. For expressions in the third case, if the expression is available in the half-cycle cut-off time, it is marked as a half-cycle gate. Otherwise, if it is available inside the full-cycle cut-off, it is marked as a full-cycle gate.
    If the expression is too late to use even in a full-cycle gate, a back-off strategy is applied. The gated synthesis algorithm stores undo information along with the gating expression, so that the gated synthesis algorithm can perform the back-off strategy.
4. In the fourth case, if the hopeful half-cycle expression is available inside the half-cycle cut-off, it is used as a half-cycle gate. Otherwise, if the backup full-cycle expression is available within the full-cycle cut-off, that is used as a full-cycle gate.
    Otherwise, neither of these expressions are used. Undo clauses are not required in this case.

Optimization: sometimes the half-cycle expression won't be available within the half-cycle cutoff, but the backup full-cycle expression is; in this case, the full-cycle expression is promoted to a half-cycle gate.

The output of the algorithm is, for each DFF in the design, a set of fully-determined gating expressions. These FDGEs are either half-cycle gating expressions, or full-cycle gating expressions.

These fully-determined gating expressions are then passed to the final stage of the hierarchical gating phase, which is a gating precedence algorithm. The gating precedence algorithm is a procedure that takes the list of gating expressions for each DFF in the circuit design, and produces a layered clock distribution tree using both full-cycle and half-cycle gates. Simulation data can be used to direct the algorithm, or it can run on its own.

The input to the gating precedence algorithm is the output of the AHCG algorithm. Thus the input is a set of parameters of the form (expression, half-cycle) or (expression, full-cycle) for each DFF in the design. Each DFF may be associated with multiple expressions. It should be noted that these may include original expressions which were 'stripped' in the initial phase prior to netlist gating.

Figure 10:
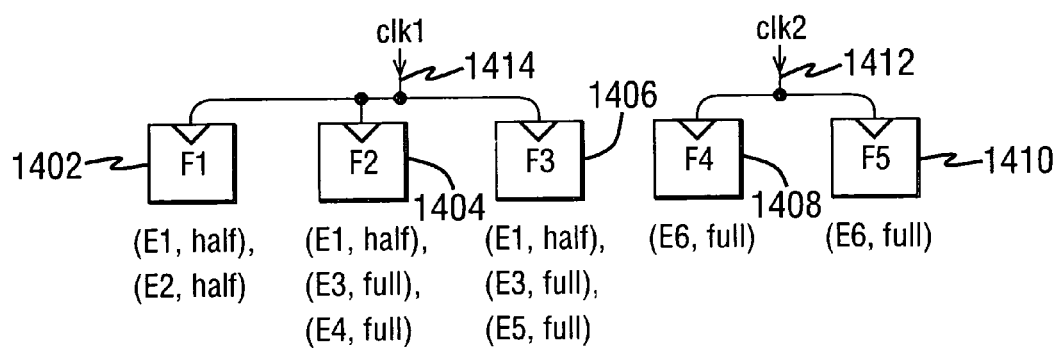
FIG. 10 illustrates the inputs for a fifth principle stage of operation in accordance with a preferred embodiment of the present invention.

The set of expressions at the input to the gating precedence algorithm is represented graphically as shown in FIG. 10. FIG. 10 shows a set of DFFs 1402,1404,1406 each associated with a clock clk1 on line 1414, and a set of DFFs 1408,1410 each associated with a clock clk2 on line 1412. Each DFF is associated with at most one clock wire. Each DFF is associated with at least one full or half-cycle gating expressions, and certain gates are associated with a plurality of such expressions.

The purpose of the gating precedence algorithm is to determine a hierarchical gating structure which takes advantage of redundancies for those DFFs having common gating expressions based on the same clock.

The preferred gating precedence algorithms provide a hierarchical structure in which half-cycle and full-cycle gates are mixed. However, it is also ensured that whenever they are mixed, the half-cycle gates are placed above the full-cycle gates. This is because the Applicant has recognized that if the gated clock output of a half-cycle gate is connected to the clock input of a full-cycle gate, the clock gating works correctly, whilst if the gated clock output of a full-cycle gate is connected to the clock input of a half-cycle gate (i.e. the other way round), the clock gating does not work correctly.

In the prior art designers have always sought to design circuits which are exclusively based on one or the other of half-cycle gates or full-cycle gates, as a result of a prejudice in the art which perceived an incompatibility between the two clock gate types. This prejudice lead designers to always avoid using both types in a single design. In contrast, the present Applicant has recognized the advantages of using both half-cycle and full-cycle gates in a single design.

Figure 12:
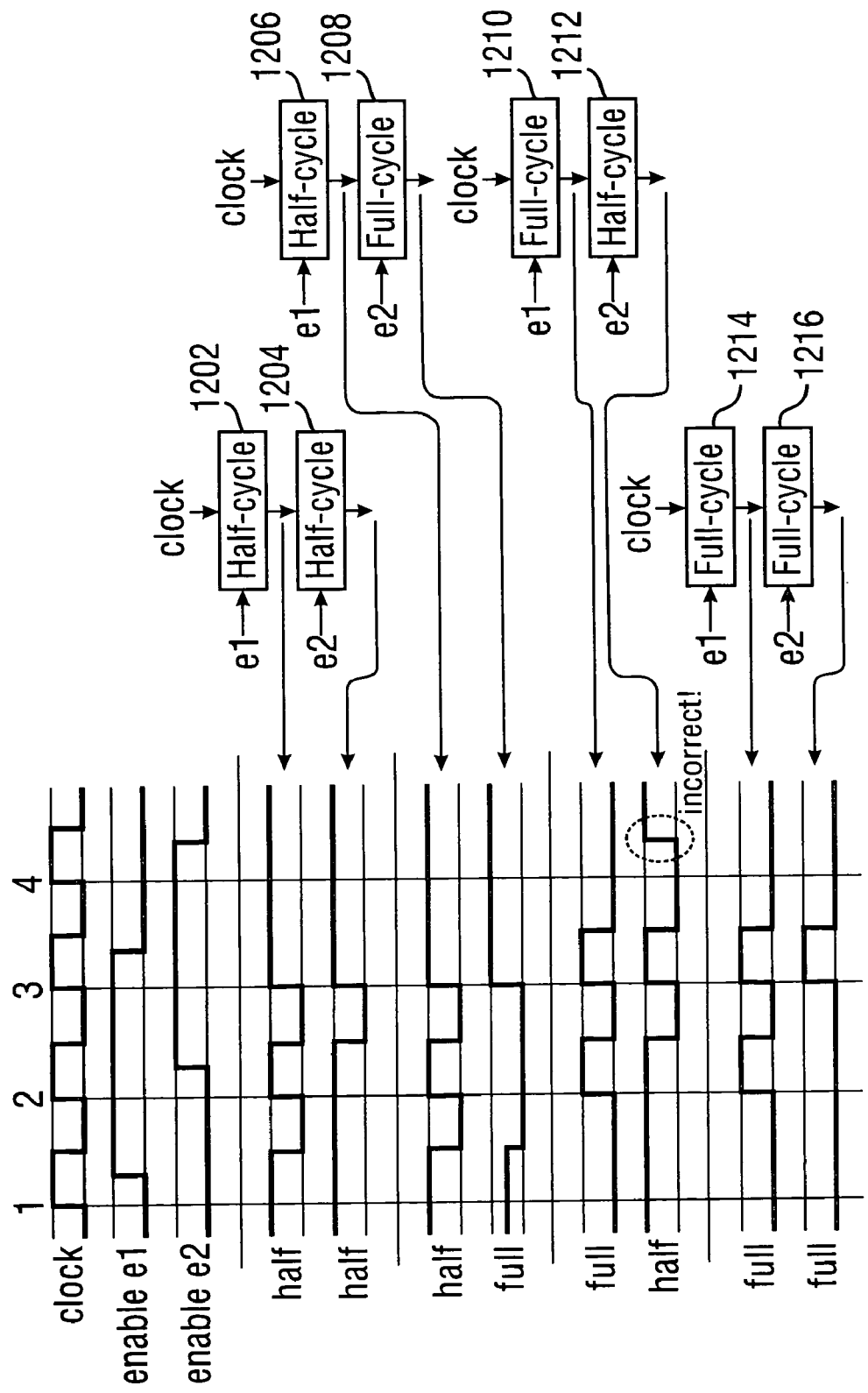
FIG. 12 illustrates an understanding of the important constraints in mixing half- and full-cycle clock gates.

FIG. 12 shows the problems that can occur when full-cycle gating is placed above half-cycle gating in a design. Enable e1 enables clock pulses 2 and 3, and enable e2 enables pulses 3 and 4, and as such the correct behaviour should be a rising edge on clock pulse 3. All four variants of full/half above full/half correctly show a rising edge at clock pulse 3, but the dotted circle shows an extra rising edge just after pulse 4 when full-cycle gating is placed above half-cycle gating. As a result, the Applicant has recognized that the provision of full-cycle gates above half-cycle gates must be avoided, but that there is no constraint in placing half-cycle gates above full-cycle gates.

Hierarchical gating structures save power compared to flat structures, because the fast-switching main clock goes to fewer places.

There are two versions of the gating precedence algorithm described hereinbelow, which are similar but differ in the way that they prevent full-cycle being placed above half-cycle gates.

The aim of the gating precedence, in a preferred embodiment, is to create a tree-like gating structure that allows for the incorporation of both full-cycle and half-cycle gates, but does not place any full-cycle gates above half-cycle gates. The described algorithms produces a small, efficient gating structure.

Figure 11:
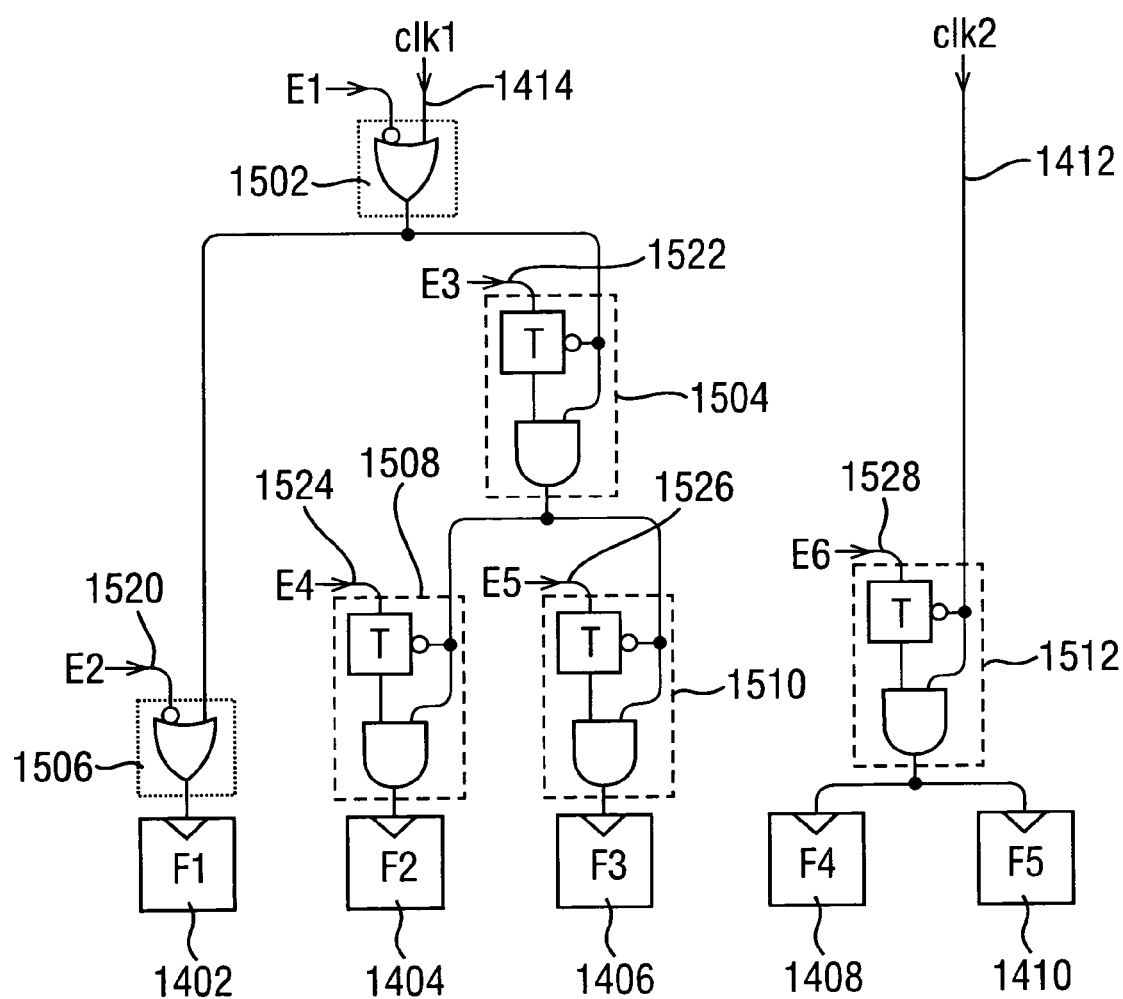
FIG. 11 illustrates the construction of a hierarchical gating structure in accordance with a preferred embodiment of the present invention.

A first example algorithm, in pseudocode, is:
Let set S be all the clock wires. In FIG. 10, S={clk1, clk2}
While S is not empty do
    Get a wire 107 from S. In FIG. 10, 107 could be clk1.
    If there are DFFs attached to 107 then
        Go through all the DFFs attached to wire 107. Make a tally of the different gating expressions that are used in those DFFs.
        For FIG. 10 with 107 as clk1, the tally is (E1, half)=3, (E2, half)=1, (E3, full)=2, (E4, full)=1, (E5, full)=1.
        Pick the half-cycle expression that appears the most times in the tally. Set a parameter Expression to be equal to this gating expression and a parameter GatingType is set to be half.
        In the Example of FIG. 10, the parameter Expression=E1.
        If there are no half-cycle expressions, then the parameter Expression is set to be the full-cycle expression that occurs the most times, and the parameter GatingType is set to be full.
        Create a new wire 107', and a clock gating cell of the correct type (look at GatingType) with clock input 107, gated clock output 107', and enable input Expression.
        Go through all DFFs clocked from 107. If (Expression, GatingType) is in the gating set for a particular DFF $f$, remove (Expression, GatingType) from the gating set, disconnect $f$ from the clock wire 107, and connect $f$ to the gated clock wire 107'.
        Add 107' to S.
    else if there are no DFFs attached to 107
        Remove 107 from the set S.
    end if
end while This algorithm, when run on a set of inputs corresponding to the graphical representation of FIG. 10, gives the results shown in FIG. 11. In FIG. 11, a hierarchical gating structure drives each DFF, ensuring that each DFF is still driven by its associated expressions, with shared expressions being higher up the hierarchical tree. The hierarchical structure of FIG. 11 has three levels.

At a first level, the DFF 1506 is clocked by a half-cycle gate 1506, under the control of an expression E2 on line 1520. The DFFs 1404,1406, are clocked by respective full-cycle clock gates 1508,1510 under the control of respective expressions E4,E5. DFFs 1408 and 1410 are clocked by full-cycle clcok gate 1512 under control of expression E6.

At a second level, the full cycle clock gates 1524 and 1526 are fed by a full cycle clock gate 1504 operating under the control of expression E3 on line 1522.

At a third level, the full cycle clock gate 1504, and the half cycle clock gate 1506, are fed by the output of half-cycle clock gate 1502 operating under the control of expression E1 on line 1502, and being fed by the clock signal clk1 on line 1414.

This algorithm described above picks half-cycle gates as a priority, and so will always ensure that a full-cycle gate cannot be above a half-cycle gate. An alternative strategy would be to have no such a priority about the different types of gating while creating the structure, but then demote any half-cycle gates to full-cycle gates if they are found under a full-cycle gate in the final tree. The second variant of the algorithm achieves this.

A second example algorithm, in pseudocode, is:
Let set S be all the clock wires.
while S is not empty do
    Get a wire 107 from S. Here, 107 could be clk1.
    If there are DFFs attached to 107 then
        Go through all the DFFs attached to wire 107. Make a tally of the different gating expressions that are used in those DFFs
        Pick the expression that appears the most times in the tally, and set Expression to be equal to the gating expression and GatingType as the type of that expression.
        Create a new wire 107', and a clock gating cell of the correct type (look at GatingType) with clock input 107, gated clock output 107', and enable input Expression.
        Go through all DFFs clocked from 107. If (Expression, GatingType) is in the gating set for a particular DFF $f$, remove (Expression, GatingType) from the gating set, disconnect $f$ from the clock wire 107, and connect $f$ to the gated clock wire 107'. Additionally, if GatingType is full, scan through all the clock gates for $f$. If any are half-cycle, change them to full-cycle.
        Add 107' to S.
    else if there are no DFFs attached to 107
        Remove 107 from the set S.
    end if
end while The second version of the algorithm is slightly inferior in area and power terms than the former, but may become important as more information is added to the decision process. The differences are small, however—the example in FIG. 10 gives the same result, ie. the hierarchical arrangement of FIG. 11, with both algorithms.

The preferred gating precedence algorithms provide a hierarchical structure in which half-cycle and full-cycle gates are mixed. However, it is also ensured that whenever they are mixed, the half-cycle gates are placed above the full-cycle gates. This is because the Applicant has recognized that if the gated clock output of a half-cycle gate is connected to the clock input of a full-cycle gate, the clock gating works correctly, whilst if the gated clock output of a full-cycle gate is connected to the clock input of a half-cycle gate (i.e. the other way round), the clock gating does not work correctly.

In summary, there are a number of key embodiments for implementing a clock gating scheme for a synchronous circuit set out herein, each of which is associated with various advantages.

Embodiments allow for automatically picking between half-cycle and full-cycle clock gates depending on timing data, and using both types of clock gates in the same design. This allows a trade of speed for power, which has not previously been possible in the prior art.

Embodiments allow for automatically determining how many clocked state-holding elements to gate together, based upon information about how the circuit is used and an area-power weighting. This also allows a trade of area for power.

Embodiments further allow for automatically creating tree-like clock-gating structures to maximize the power saving.

Figure 13:
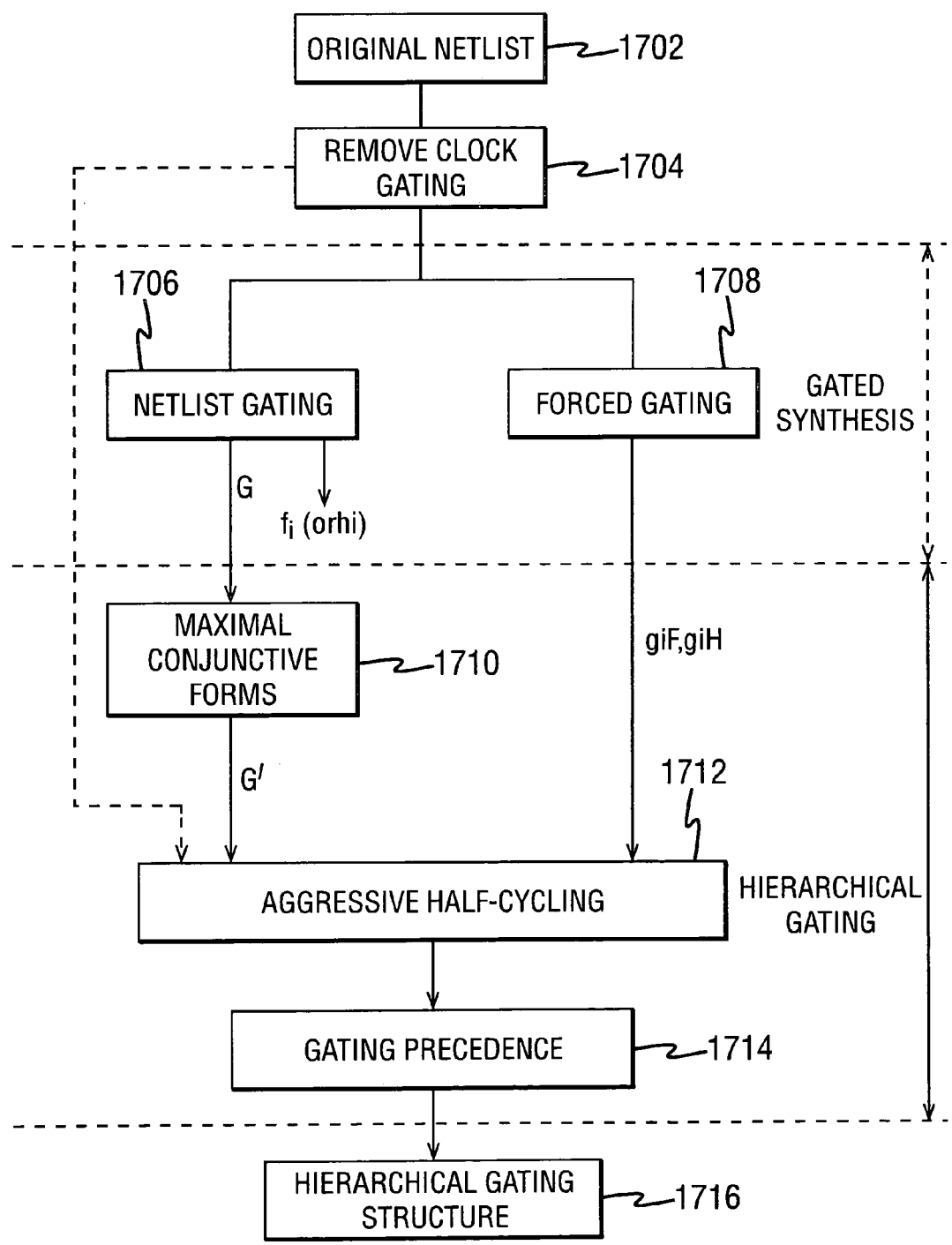
FIG. 13 is an overview of the interaction of the preferred embodiment of the present invention.

FIG. 13 illustrates an overview of how the various aspects and embodiments of the invention discussed herein fit together for a highly advantageous technique for generating a clock gating structure. The overall function of the preferred algorithms together is to create advantageous hierarchical clock-gating circuits, but this is achieved in two distinct phases. The first phase, consisting of the netlist gating and forced gating algorithms, take an ungated circuit and label each clocked state-holding element in the circuit with expressions that can be used to gate that clocked state-holding element. The second phase, consisting of the maximal conjunctive forms algorithm, aggressive half-cycle gating algorithm and gating precedence algorithm, take these expressions and create physical clock gates.

Referring to FIG. 13, in a first step 1702 the original netlist is taken, and in a step 1704 the original clock gating in such netlist is removed. In alternatives, the circuit without any gating may be simply provided.

In a step 1706 a netlist gating function is implemented, which in the preferred embodiment includes an initial step of finding a common set. In a step 1708, a forced gating function is performed.

In a step 1710, the functions generated in the netlist gating step 1706 are optimized by the application of maximal conjunctive forms.

In a step 1712, the optimized functions from step 1710, and the gating expressions from step 1708, are processed in an aggressive half-cycling step such that half-cycle expressions are prioritized over full-cycle expressions. This step may also preferably receive and process any clock gating expressions removed in step 1704.

In a step 1714 a gating precedence function is performed in order to construct the hierarchical clock gating structure. The hierarchical clock gating structure is thus produced in step 1716.

The invention has been described herein by way of reference to particular examples and embodiments. It will be apparent to one skilled in the art that the invention is not limited to such embodiments. The scope of protection is defined by the appended claims.

The invention claimed is:

1. A method of determining a clock gating function for each of a set of clocked state-holding elements, wherein the elements have at least one common input and the method comprises the steps of:
    a. determining, for each element, the conditions under which the element will hold its current value based only on the common inputs; and
    b. combining, for each element, the determined conditions to form the clock gating function for that element.

2. The method according to claim 1, further comprising the step of, for each element, defining a Boolean function comprising variables forming the input to each element.

3. The method according to claim 2 wherein the step of determining the conditions under which the element will hold its current value is based on said Boolean functions.

4. The method according to claim 2 wherein the Boolean function is limited to the variables being common to the inputs of all elements.

5. The method according to any one of claim 2, further comprising the steps of: determining a first set of variables that are common to logic functions forming the input to all elements; and determining a second set of variables that are not common to logic functions forming the input to all elements, such that, in tracing back an input of any element, a variable of each set is always found.

6. The method according to claim 5 wherein the step of defining the Boolean function for each element is dependent upon those variables in the first and second sets.

7. The method according to claim 5 wherein the step of defining the Boolean function for each element is dependent only upon those variables in the first set.

8. A method according to claim 7, wherein the step of defining the Boolean function for each element further comprises the steps of defining a Boolean function in dependence on those variables in the first sets, and subsequently eliminating those variables in the second set.

9. The method according to any one of claim 5 wherein the step of determining the first and second sets of inputs comprises the steps of:
    a. defining an input cone for each element, each input cone being determined by tracing back from the input of its respective element through a predetermined number of gates, and entering all variables located in that input cone;
    b. determining variables in the input cones that are common to all input cones;
    c. tracing back from each element until any common variable is found, wherein all common variables found define a first set of variables;
    d. tracing back from each element until a variable in the first set is found, wherein all such traced back variables define a set L;
    e. defining a set M which comprises all variables in the input cones that are not included in set L; and
    f. tracing back from each element until a variable in the set M is found, wherein all variables that can be so traced back define a second set of variables.

10. The method according to claim 9 wherein a maximum size is allocated to the first set, further comprising the step of terminating the step c) if said maximum size is reached.

11. The method according to claim 9 wherein the tracing of an input path is terminated in step c) if a common variable is identified.

12. The method according to claim 9 wherein the tracing of an input path is terminated in step c) if a variable not in an input cone is identified.

13. The method according to claim 2 wherein the method is enabled responsive to the Boolean function for each element being dependent upon the output of that element.

14. The method according to claim 2 further comprising the step of, for each element, determining a revised Boolean function which provides the same result as the defined Boolean function when the gating function has a logical value of 1.

15. The method according to claim 14 further comprising the step of selectively replacing a defined Boolean function with a revised Boolean function in dependence upon a comparison of each defined and revised Boolean function to determine the most efficient function.

16. The method according to claim 15 wherein the most efficient function is the one that can be implemented with a smaller number of implementations in terms of logical gates.

17. The method according to claim 1 wherein the conditions are combined in an AND function.

18. The method according to claim 1 further comprising the step of creating a gate structure corresponding to the combined conditions.

19. A computer program product comprising a computer program code for determining a clock gating function for each of a set of clocked state-holding elements, wherein the elements have at least one common input and the method comprises the steps of:
   a. determining, for each element, the conditions under which the element will hold its current value based only on the common inputs; and
   b. combining, for each element, the determined conditions to form the clock gating function for that element.

20. An apparatus for determining a clock gating function for each of a set of clocked holding state elements, wherein the elements have at least one common input and the apparatus comprises:
   a. means for determining, for each element, the conditions under which that element will hold its current value based only on the common inputs; and
   b. means for combining, for each element, the determined conditions to form the gating function for that element.

21. The apparatus according to claim 20, further comprising means for defining, for each element, a Boolean function comprising the variables forming the input to each element.

22. The apparatus according to claim 20 further comprising: means for determining a first set of variables that are common to logic functions forming the input to all elements; and means for determining a second set of variables that are not common to logic functions forming the input to all elements, such that in tracing back an input of any element, a variable of each set is always found.

23. The apparatus according to claim 22 comprising:
   a. means for defining an input cone for each element, each input cone being determined by tracing back from the input of its respective element through a predetermined number of gates, and entering all variables located in that input cone;
   b. means for determining variables in the input cones that are common to all input cones;
   c. means for tracing back from each element until any common variable is found, wherein all common variables found define a first set of variables;
   d. means for tracing back from each element until a variable in the first set is found, wherein all such traced back variables define a set L;
   e. means for defining a set M which comprises all variables in the input cones which are not included in set L; and
   f. means for tracing back from each element until a variable in the set M is found, wherein all variable that can be so traced back define a second set of variables.

24. A computer system comprising the apparatus for determining a clock gating function for each of a set of clocked holding state elements, wherein the elements have at least one common input and the apparatus comprises:
   a. means for determining, for each element, the conditions under which that element will hold its current value based only on the common inputs; and
   b. means for combining, for each element, the determined conditions to form the gating function for that element.

* * * * *